US012796185B2

(12) United States Patent
Li et al.

(10) Patent No.: US 12,796,185 B2
(45) Date of Patent: Nov. 10, 2026

(54) DISPLAY APPARATUS AND METHOD OF MANUFACTURING THE SAME

(71) Applicant: Samsung Display Co., Ltd., Yongin-si (KR)

(72) Inventors: Xinxing Li, Yongin-si (KR); Byunghee Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 414 days.

(21) Appl. No.: 18/508,318

(22) Filed: Nov. 14, 2023

(65) Prior Publication Data

US 2024/0322089 A1 Sep. 26, 2024

(30) Foreign Application Priority Data

Mar. 24, 2023 (KR) ........................ 10-2023-0039236
May 17, 2023 (KR) ........................ 10-2023-0063797

(51) Int. Cl.
*H10K 59/38* (2023.01)
*H10H 20/851* (2025.01)
(Continued)

(52) U.S. Cl.
CPC .... *H10H 20/8514* (2025.01); *H10H 20/8512* (2025.01); *H10W 90/00* (2026.01); *H10H 20/0361* (2025.01)

(58) Field of Classification Search
CPC .. H10K 59/38; H10K 59/1201; H10K 59/122; H10K 71/00; H01L 33/505; H01L 25/0753; H01L 33/502
See application file for complete search history.

(56) References Cited

U.S. PATENT DOCUMENTS 8,766,299 B2 7/2014 Iwasaki
10,205,129 B2 2/2019 Xu
(Continued)

FOREIGN PATENT DOCUMENTS

JP 5601025 10/2014
KR 1998-0041086 8/1998
(Continued)

*Primary Examiner* — Joseph L Williams
(74) *Attorney, Agent, or Firm* — CANTOR COLBURN LLP

(57) ABSTRACT

A display apparatus includes a first light-emitting device, a second light-emitting device adjacent to the first light-emitting device, a third light-emitting device adjacent to the second light-emitting device, a bank layer disposed on the first light-emitting device, the second light-emitting device, and the third light-emitting device, and including a first hole overlapping the first light-emitting device, a second hole overlapping the second light-emitting device, and a third hole overlapping the third light-emitting device, a first color element disposed in the first hole, a second color element disposed in the second hole, a third color element disposed in the third hole, a first inorganic layer overlapping the first color element on the bank layer, the first inorganic layer including a first opening overlapping the second color element and a second opening overlapping the third color element, and a second inorganic layer disposed on the first inorganic layer.

20 Claims, 18 Drawing Sheets

(51) Int. Cl.

| | |
|---|---|
| ***H10K 59/12*** | (2023.01) |
| ***H10K 59/122*** | (2023.01) |
| ***H10K 71/00*** | (2023.01) |
| ***H10W 90/00*** | (2026.01) |
| *H10H 20/01* | (2025.01) |

(56) References Cited

U.S. PATENT DOCUMENTS

| | | | | |
|---|---|---|---|---|
| 2022/0140291 | A1* | 5/2022 | Kim | H10K 59/122<br>257/40 |
| 2023/0109508 | A1 | 4/2023 | Kwak et al. | |

FOREIGN PATENT DOCUMENTS

| | | |
|---|---|---|
| KR | 10-1723880 | 4/2017 |
| KR | 10-2022-0037716 | 3/2022 |

* cited by examiner

DISPLAY APPARATUS AND METHOD OF MANUFACTURING THE SAME

CROSS-REFERENCE TO RELATED APPLICATION(S)

This application claims priority, under 35 U.S.C. § 119, to Korean Patent Application No. 10-2023-0039236, filed on Mar. 24, 2023, and Korean Patent Application No. 10-2023-0063797, filed on May 17, 2023, in the Korean Intellectual Property Office, the entire contents of which are incorporated herein by reference.

BACKGROUND

1. Technical Field

One or more embodiments relate to a display apparatus and a method of manufacturing the display apparatus. More particularly, one or more embodiments relate to a display apparatus in which a pixel of a smaller area may be implemented by forming a color element pattern layer by using an entire application process and a planarization process without an inkjet process or a photo process, and a method of manufacturing the display apparatus.

2. Description of the Related Art

A display apparatus is an apparatus that receives information about an image and displays the image. A sub-pixel of a display apparatus may include a light-emitting device disposed at a lower position and a color element disposed at an upper position. The color element may include quantum dots and a color filter for adjusting the color of light. In order to achieve a high resolution, the area of the sub-pixel should be small, and thus, the patterning area of the color element should also be small. In case that a conventional inkjet process or photo process is used, there is a limitation that the patterning area of the color element is reduced.

SUMMARY

There is a need for a method of realizing a smaller area than the area of a color element pattern layer that may be realized by using a conventional inkjet process or photo process. One or more embodiments provide a method of applying a color element layer to an entire surface of a bank layer having a hole and removing a portion of the color element layer disposed outside the hole of the bank layer to form each color element pattern layer.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a first light-emitting device, a second light-emitting device adjacent to the first light-emitting device, a third light-emitting device adjacent to the second light-emitting device, a bank layer disposed on the first light-emitting device, the second light-emitting device, and the third light-emitting device, and including a first hole overlapping the first light-emitting device, a second hole overlapping the second light-emitting device, and a third hole overlapping the third light-emitting device, a first color element disposed in the first hole, a second color element disposed in the second hole, a third color element disposed in the third hole, a first inorganic layer overlapping the first color element on the bank layer, the first inorganic layer including a first opening overlapping the second color element and a second opening overlapping the third color element, and a second inorganic layer disposed on the first inorganic layer.

The second inorganic layer may overlap the first color element and the second color element, and may include an opening overlapping the third color element.

The first light-emitting device, the second light-emitting device, and the third light-emitting device may emit light of a same color.

Each of the first inorganic layer and the second inorganic layer may include an inorganic insulating material.

An upper surface of the first color element and an upper surface of the bank layer may be coplanar with each other.

An upper surface of the second color element and an upper surface of the first inorganic layer may be coplanar with each other, and an upper surface of the third color element and an upper surface of the second inorganic layer may be coplanar with each other.

The first color element may include a first color conversion pattern layer including first quantum dots, the second color element may include a second color conversion pattern layer including second quantum dots, and the third color element may include a light-transmitting pattern layer.

The first color element may further include a first color filter, the second color element may further include a second color filter, and the third color element may further include a third color filter.

The display apparatus may further include a third inorganic layer disposed on the second inorganic layer and overlapping the first color element, the second color element, and the third color element.

The display apparatus may further include a fourth light-emitting device adjacent to the third light-emitting device, and a fourth color element disposed in a fourth hole of the bank layer overlapping the fourth light-emitting device.

The first light-emitting device, the second light-emitting device, the third light-emitting device, and the fourth light-emitting device may emit white light.

The first color element may include a first color filter, the second color element may include a second color filter, the third color element may include a third color filter, and the fourth color element may include a light-transmitting pattern layer.

According to one or more embodiments, a method of manufacturing a display apparatus may include forming a first light-emitting device, a second light-emitting device, and a third light-emitting device, forming a bank layer on the first light-emitting device, the second light-emitting device, and the third light-emitting device, forming, in the bank layer, a first hole overlapping the first light-emitting device, forming a first color element forming layer on the bank layer so that at least a part of the first color element forming layer may be disposed in the first hole, removing a part of the first color element forming layer formed outside the first hole so that a first color element may be disposed in the first hole, forming a first inorganic layer including an opening overlapping the second light-emitting device on the bank layer, the first inorganic layer overlapping the first color element, forming, in the bank layer, a second hole overlapping the second light-emitting device, forming a second color element forming layer on the bank layer so that at least a part of the second color element forming layer may be disposed in the second hole, removing a part of the second color element forming layer formed outside the second hole so that a second color element may be disposed in the second hole, and forming a second inorganic layer on the first inorganic layer.

In the forming of the second inorganic layer, the second inorganic layer may overlap the first color element disposed in the first hole of the bank layer and the second color element disposed in the second hole of the bank layer, and may include an opening overlapping the third light-emitting device.

The method may further include forming, in the first inorganic layer, an opening overlapping the third light-emitting device.

The method may further include forming, in the bank layer, a third hole overlapping the third light-emitting device, forming a third color element forming layer on the bank layer so that at least a part of the third color element forming layer may be disposed in the third hole, and removing a part of the third color element forming layer formed outside the third hole so that a third color element may be disposed in the third hole.

In the removing of the part of the first color element forming layer, an upper surface of the first color element and an upper surface of the bank layer may be coplanar with each other, and in the removing of the part of the second color element forming layer, an upper surface of the second color element and an upper surface of the first inorganic layer may be coplanar with each other.

In the removing of the part of the third color element forming layer, an upper surface of the third color element and an upper surface of the second inorganic layer may be coplanar with each other.

The forming of the first color element forming layer may include forming a first color conversion layer including first quantum dots, and the forming of the second color element forming layer may include forming a second color conversion layer including second quantum dots.

The forming of the first color element forming layer may include forming a first color filter layer disposed on the first color conversion layer, and the forming of the second color element forming layer may include forming a second color filter layer disposed on the second color conversion layer.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
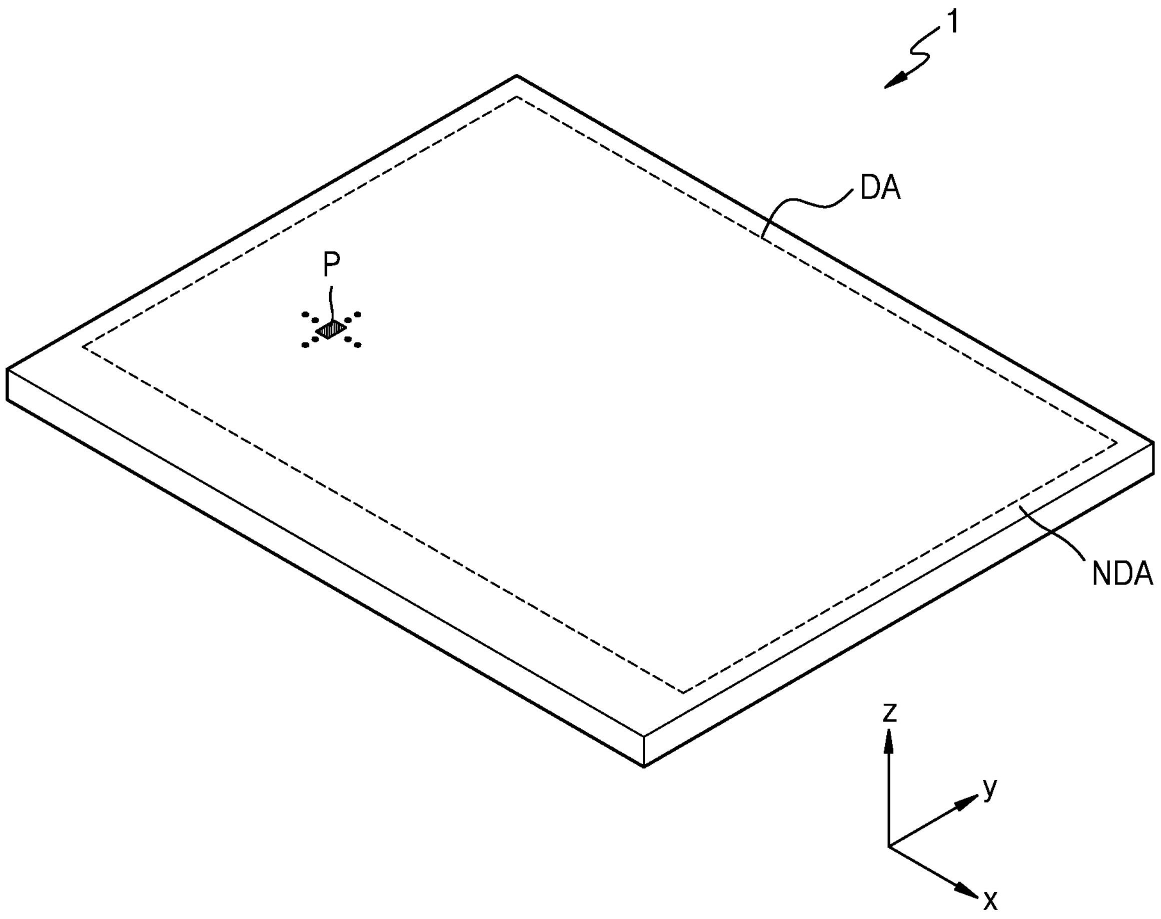
FIG. 1 is a schematic perspective view illustrating a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the x-axis, the y-axis, and the z-axis are not limited to three axes of a rectangular coordinate system, such as the x, y, and z axes, and may be interpreted in a broader sense. For example, the x-axis, the y-axis, and the z-axis may be perpendicular to one another, or may represent different directions that are not perpendicular to one another. For the purposes of this disclosure, "at least one of A and B" may be construed as understood to mean A only. B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the invention. Further, the blocks, units, and/or modules of some embodiments may be physically combined into more complex blocks, units, and/or modules without departing from the scope of the invention.

FIG. 1 is a schematic perspective view illustrating a display apparatus according to an embodiment.

Referring to FIG. 1, a display apparatus 1 may include a display area DA, and a non-display area NDA disposed outside the display area DA. The display area DA may display an image through a sub-pixel P disposed in the display area DA. The non-display area NDA, which is disposed outside the display area DA and does not display an image, may surround (e.g., entirely surround) the display area DA. A driver or the like for applying an electrical signal or power to the display area DA may be disposed in the non-display area NDA. A pad, to which an electronic device or a printed circuit board is electrically connected, may be disposed in the non-display area NDA.

In an embodiment, although the display area DA has a polygonal shape (e.g., a quadrangular shape) in which a length in an x-axis direction is greater than a length in a y-axis direction in FIG. 1, in another example, the display apparatus 1 may have a polygonal shape (e.g., a quadrangular shape) in which a length in the y-axis direction is greater than a length in the x-axis direction. Although the display area DA has a substantially quadrangular shape in FIG. 1, embodiments are not limited thereto. In another example, the display area DA may have any of various shape such as an N-gon shape (where N is a natural number of 3 or more), a circular shape, or an elliptical shape. Although the display area DA has a shape with corners where straight lines meet each other in FIG. 1, in another example, the display area DA may have a polygonal shape with curved corners.

According to an embodiment, the display apparatus 1 may be applied to any of various products such as a television, a laptop computer, a monitor, an advertisement board, or an Internet of things (IoT) product as well as a portable electronic device such as a mobile phone, a smartphone, a tablet personal computer (PC), a mobile communication terminal, an electronic organizer, an electronic book, a portable multimedia player (PMP), a navigation device, or an ultra-mobile PC (UMPC). For example, the display apparatus 1 according to an embodiment may be applied to a wearable device such as a smart watch, a watch phone, a glasses-type display, or a head-mounted display (HMD). For example, the display apparatus 1 according to an embodiment may be applied to a center information display (CID) disposed on an instrument panel, a center fascia, or a dashboard of a vehicle, a room mirror display replacing a side-view mirror of a vehicle, or a display screen disposed on the back (or rear side) of a front seat for entertainment for a person in a back seat of a vehicle.

Figure 2:
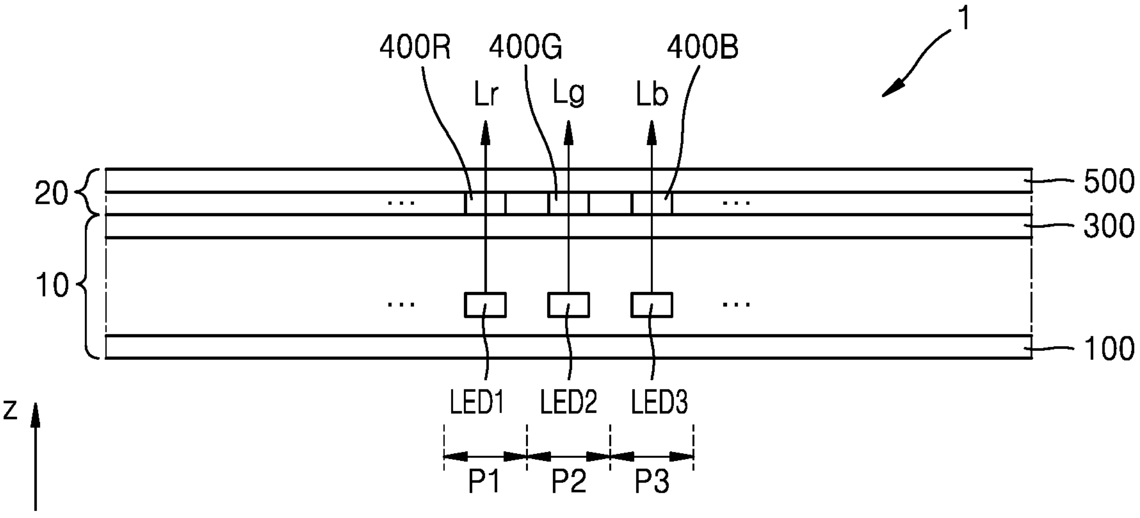
FIGS. 2 and 3 are schematic cross-sectional areas illustrating a display apparatus according to an embodiment.
Figure 3:
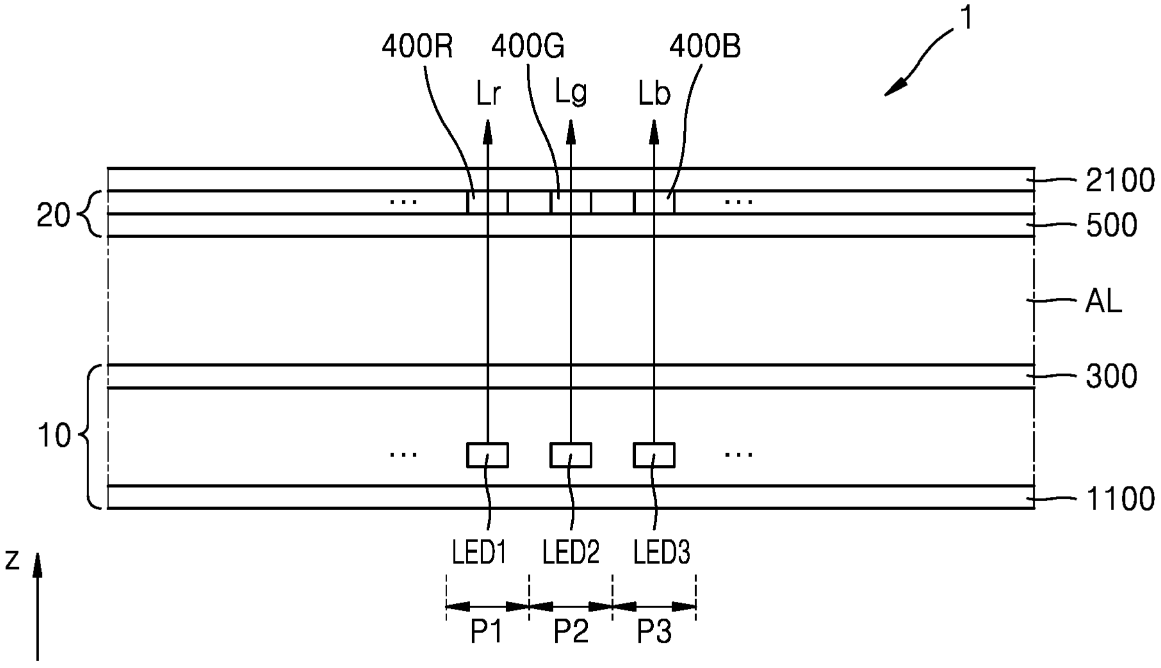

FIGS. 2 and 3 are schematic cross-sectional views illustrating a part of a display apparatus according to an embodiment.

Referring to FIG. 2, the display apparatus 1 may include a display unit 10 and a color element unit 20 disposed on the display unit 10.

The display apparatus 1 may include a first sub-pixel P1, a second sub-pixel P2, and a third sub-pixel P3. The first sub-pixel P1, the second sub-pixel P2, and the third sub-pixel P3 may be sub-pixels that emit light of different colors. For example, the first sub-pixel P1 may emit red light Lr, the second sub-pixel P2 may emit green light Lg, and the third sub-pixel P3 may emit blue light Lb.

The first sub-pixel P1, the second sub-pixel P2, and the third sub-pixel P3 may include a first light-emitting device LED1, a second light-emitting device LED2, and a third light-emitting device LED3. For example, the first sub-pixel P1 may include the first light-emitting device LED1, the second sub-pixel P2 may include the second light-emitting device LED2, and the third sub-pixel P3 may include the third light-emitting device LED3. The first light-emitting device LED1, the second light-emitting device LED2, and the third light-emitting device LED3 may emit light of the same color. For example, the first light-emitting device LED1, the second light-emitting device LED2, and the third light-emitting device LED3 may emit blue light.

The display unit 10 may include a substrate 100, the first to third light-emitting devices LED1, LED2, and LED3 disposed on the substrate 100, an encapsulation layer 300 disposed on the first to third light-emitting devices LED1, LED2, and LED3.

The color element unit 20 may include first to third color elements 400R, 400G, and 400B, and an inorganic layer 500 disposed on the first to third color elements 400R, 400G, and 400B.

The first to third color elements 400R, 400G, and 400B may be disposed to correspond to the first to third light-emitting devices LED1, LED2, and LED3. For example, the first color element 400R may be disposed to correspond to (or to overlap) the first light-emitting device LED1, the second color element 400G may be disposed to correspond to (or to overlap) the second light-emitting device LED2, and the third color element 400B may be disposed to correspond to (or to overlap) the third light-emitting device LED3. Light emitted from the first light-emitting device LED1, the second light-emitting device LED2, and the third light-emitting device LED3 may pass through the first to third color elements 400R, 400G, and 400B to respectively emit red light Lr, green light Lg, and blue light Lb.

The color element unit 20 may be disposed on the display unit 10. In an embodiment, the color element unit 20 may be formed (e.g., directly formed) on the display unit 10. For example, the first to third color elements 400R, 400G, and 400B may be formed (e.g., directly formed) on a top surface (or upper surface) of the encapsulation layer 300 of the display unit 10. For example, in case that the first to third color elements 400R, 400G, and 400B are formed (e.g., directly formed) on the top surface (or upper surface) of the encapsulation layer 300, it may mean that the first to third color elements 400R, 400G, and 400B are not separately manufactured and attached to the encapsulation layer 300, but the first to third color elements 400R. 400G, and 400B are formed (e.g., directly formed) on the encapsulation layer 300.

Referring to FIG. 3, the display apparatus 1 may include the display unit 10, the color element unit 20, an adhesive layer AL, and a second substrate 2100.

The display unit 10 may include a first substrate 1100. A stacked structure of the first to third light-emitting devices LED1, LED2, and LED3 and the encapsulation layer 300 described with reference to FIG. 2 may be formed on the first substrate 1100.

The color element unit 20 may be disposed on the second substrate 2100. For example, the first to third color elements 400R, 400G, and 400B may be disposed on the second substrate 2100. The first to third color elements 400R, 400G, and 400B may be formed (e.g., directly formed) on the second substrate 2100. The inorganic layer 500 may be disposed on the first to third color elements 400R, 400G, and 400B.

For example, the second substrate 2100 and the color element unit 20 may be adhered (or coupled) to the display unit 10 so that the first to third color elements 400R, 400G, and 400B may face the first to third light-emitting devices LED1, LED2, and LED3. For example, the color element unit 20 and the display unit 10 may be adhered through the adhesive layer AL so that the first color element 400R may face the first light-emitting device LED1, the second color element 400G may face the second light-emitting device LED2, and the third color element 400B may face the third light-emitting device LED3.

The adhesive layer AL may include, for example, an optically clear adhesive (OCA) or an optically clear resin (OCR). However, embodiments are not limited thereto. In another example, the adhesive layer AL may be omitted, and the encapsulation layer 300 of the display unit 10 and the inorganic layer 500 of the color element unit 20 may contact (e.g., directly) contact each other.

Figure 4:
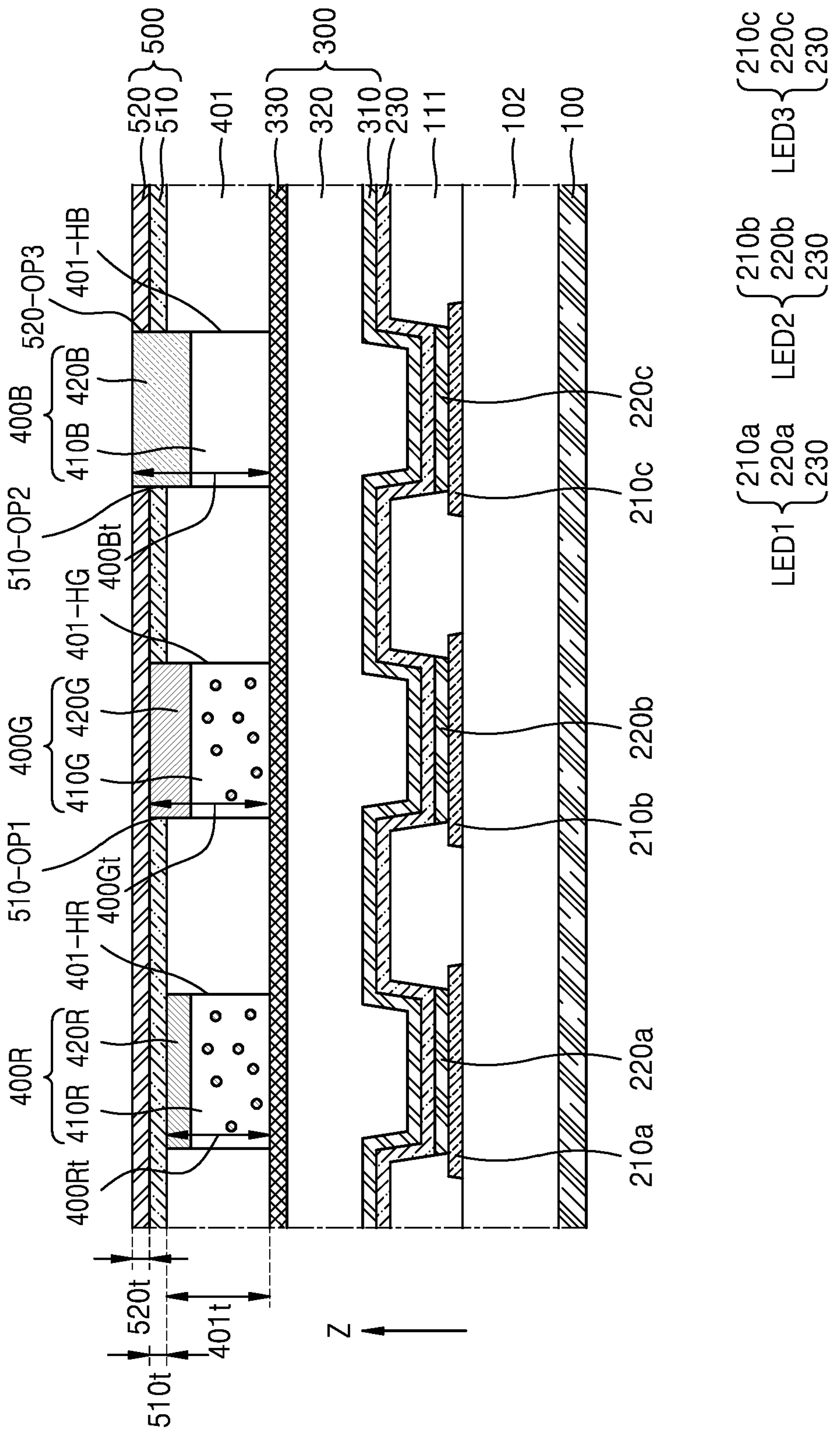
FIG. 4 is a schematic cross-sectional view illustrating a part of a display apparatus according to an embodiment.

FIG. 4 is a schematic cross-sectional view illustrating a part of a display apparatus according to an embodiment.

Referring to FIG. 4, the first to third light-emitting devices LED1, LED2, and LED3 and the first to third color elements 400R, 400G, and 400B corresponding to sub-pixels may be disposed on the substrate 100.

A driving circuit layer 102 may be disposed on the substrate 100. The driving circuit layer 102 may include a buffer layer, an interlayer insulating layer, a gate insulating layer, a thin-film transistor, and an organic insulating layer. The first to third light-emitting devices LED1. LED2, and LED3 may receive current through the thin-film transistor of the driving circuit layer 102.

The thin-film transistor may have a structure including an active layer, a gate electrode, a source electrode, and a drain electrode. The gate insulating layer may be disposed between the active layer and the gate electrode, and the interlayer insulating layer may be disposed between the gate electrode, the source electrode, and the drain electrode.

The organic insulating layer may be disposed on the thin-film transistor, and may have a single structure or a multi-layer structure. The organic insulating layer may include a contact hole.

First to third sub-pixel electrodes 210*a*, 210*b*, and 210*c* may be disposed on the driving circuit layer 102. For example, the first sub-pixel electrode 210*a*, the second sub-pixel electrode 210*b*, and the third sub-pixel electrode 210*c* may be disposed on the driving circuit layer 102 and may be adjacent to each other.

The first to third sub-pixel electrodes 210*a*. 210*b*, and 210*c* may be formed as reflective electrodes. Each of the first to third sub-pixel electrodes 210*a*. 210*b*, and 210*c* may include a reflective film formed of silver (Ag), magnesium (Mg), aluminum (Al), platinum (Pt), palladium (Pd), gold (Au), nickel (Ni), neodymium (Nd), iridium (Ir), chromium (Cr) or a compound thereof, and a film formed of ITO, IZO, ZnO, or $In_2O_3$ on the reflective film. However, embodiments are not limited thereto, and various modifications may be made. For example, each of the first to third sub-pixel electrodes 210*a*, 210*b*, and 210*c* may be formed of various materials, and may have a single structure or a multi-layer structure. Each of the first to third sub-pixel electrodes 210*a*, 210*b*, and 210*c* may be connected (e.g., electrically connected) to the drain electrode of the thin-film transistor through a connection metal disposed in the contact hole of the organic insulating layer.

A sub-pixel defining layer 111 may be disposed on the driving circuit layer 102. The sub-pixel defining layer 111 may cover edge portions (or edges) of the first to third sub-pixel electrodes 210*a*, 210*b*, and 210*c*. The sub-pixel defining layer 111 may include openings through which parts of the first to third sub-pixel electrodes 210*a*, 210*b*, and 210*c* are exposed. The openings of the sub-pixel defining layer 111 may correspond to areas where light of the first to third light-emitting devices LED1, LED2, and LED3 is emitted, and may define emission areas of the first to third light-emitting devices LED1, LED2, and LED3.

First to third intermediate layers 220*a*, 220*b*, and 220*c* may be respectively disposed on the first to third sub-pixel electrodes 210*a*, 210*b*, and 210*c*. For example, the first intermediate layer 220*a* may be disposed on the first sub-pixel electrode 210*a*, the second intermediate layer 220*b* may be disposed on the second sub-pixel electrode 210*b*, and the third intermediate layer 220*c* may be disposed on the third sub-pixel electrode 210*c*. Each of the first to third intermediate layers 220*a*, 220*b*, and 220*c* may include an organic emission layer (EML) including a low molecular weight material or a high molecular weight material. Each of the first to third intermediate layers 220*a*, 220*b*, and 220*c* may have a single structure or a multi-layer structure including a hole injection layer (HIL), a hole transport layer (HTL), the EML, an electron transport layer (ETL), and/or an electron injection layer (EIL).

Although the first to third intermediate layers 220*a*, 220*b*, and 220*c* are spaced apart from each other in FIG. 4, embodiments are not limited thereto. The first to third intermediate layers 220*a*, 220*c*, and 220*c* may be integral with each other or may be integrally connected to each other.

A counter electrode 230 may be disposed on the first to third intermediate layers 220*a*, 220*b*, and 220*c*. The counter electrode 230 may be a transparent electrode or a semi-transparent electrode. In case that the counter electrode 230 is a transparent electrode or a semi-transparent electrode, the counter electrode 230 may include at least one material among Ag. Al, Mg, Li, Ca, Cu, LiF/Ca, LiF/Al, MgAg, and CaAg, and may be formed as a thin film having a thickness ranging from several to tens of nm. A configuration and a material of the counter electrode 230 are not limited thereto, and various modifications may be made.

Stacked structures of the first to third sub-pixel electrodes 210*a*, 210*b*, and 210*c*, the first to third intermediate layers 220*a*, 220*b*, and 220*c*, and the counter electrode 230 may constitute (or form) the first to third light-emitting devices LED1, LED2, and LED3. For example, a stacked structure of the first sub-pixel electrode 210*a*, the first intermediate layer 220*a*, and the counter electrode 230 may constitute (or form) the first light-emitting device LED1. A stacked structure of the second sub-pixel electrode 210*b*, the second intermediate layer 220*b*, and the counter electrode 230 may constitute (or form) the second light-emitting device LED2. A stacked structure of the third sub-pixel electrode 210*c*, the third intermediate layer 220*c*, and the counter electrode 230 may constitute (or form) the third light-emitting device LED3.

The encapsulation layer 300 may be disposed on the counter electrode 230. The encapsulation layer 300 may include at least one inorganic encapsulation layer and at least one organic encapsulation layer. For example, the encapsulation layer 300 may include a first inorganic encapsulation layer 310, a second inorganic encapsulation layer 330, and an organic encapsulation layer 320 disposed between the first inorganic encapsulation layer 310 and the second inorganic encapsulation layer 330. Each of the first and second inorganic encapsulation layers 310 and 330 may include an inorganic insulating material such as silicon oxide ($SiO_x$), silicon nitride ($SiN_x$), or silicon oxynitride ($SiO_xN_y$), and the organic encapsulation layer 320 may include at least one organic material of polyethylene terephthalate, polyethylene naphthalate, polycarbonate, polyimide, polyethylene sulfonate, polyoxymethylene, polyarylate, and hexamethyldisiloxane.

A bank layer 401 may be disposed on the encapsulation layer 300. The bank layer 401 may include first to third holes 401-HR, 401-HG, and 401-HB overlapping the first to third light-emitting devices LED1, LED2, and LED3. For example, the bank layer 401 may include the first hole 401-HR overlapping the first light-emitting device LED1, the second hole 401-HG overlapping the second light-emitting device LED2, and the third hole 401-HB overlapping the third light-emitting device LED3.

The first to third holes 401-HR, 401-HG, and 401-HB may be penetration-holes passing through the bank layer 401. For example, a part of a top surface (or upper surface) of the encapsulation layer 300 may be exposed through each of the first to third holes 401-HR, 401-HG, and 401-HB.

The bank layer 401 may include a light-blocking material. For example, the bank layer 401 may have a single structure or a multi-layer structure including chromium (Cr) or chromium oxide ($CrO_x$).

At least a part of each of the first to third color elements 400R, 400G, and 400B may be disposed in each of the first to third holes 401-HR, 401-HG, and 401-HB of the bank layer 401. For example, the first color element 400R may be disposed in the first hole 401-HR. At least a part of the second color element 400G may be disposed in the second hole 401-HG, and at least a part of the third color element 400B may be disposed in the third hole 401-HB.

Thicknesses 400Rt, 400Gt, and 400Bt of the first to third color elements 400R, 400G, and 400B may be different from each other. For example, the thickness 400Rt of the first color element may be less than the thickness 400Gt of the second color element 400G, and the thickness 400Gt of the second color element 400G may be less than the thickness 400Bt of the third color element 400B.

A top surface (or upper surface) of the first color element 400R and a top surface (or upper surface) of the bank layer 401 may be disposed on the same surface or may be coplanar with each other. The first color element 400R may fill (e.g., entirely fill) the first hole 401-HR of the bank layer 401. In an embodiment, the thickness 400Rt of the first color element 400R and a thickness 401*t* of the bank layer 401 may be substantially the same as each other.

A first inorganic layer 510 may be disposed on the bank layer 401. The first inorganic layer 510 may overlap the first color element 400R. The first inorganic layer 510 may include a first opening 510-OP1 overlapping the second hole 401-HG of the bank layer 401 and a second opening 510-OP2 overlapping the third hole 401-HB.

Widths of the openings 510-OP1 and 510-OP2 of the first inorganic layer 510 and widths of the second and third holes 401-HG and 401-HB of the bank layer 401 may be substantially the same as each other. For example, a width of the first opening 510-OP1 of the first inorganic layer 510 and a width of the second hole 401-HG of the bank layer 401 may be substantially the same as each other, and a width of the second opening 510-OP2 and a width of the third hole 401-HB may be substantially the same as each other.

The first inorganic layer 510 may include an inorganic insulating material. For example, the first inorganic layer 510 may include at least one inorganic insulating material among silicon oxide ($SiO_x$), silicon nitride ($SiN_x$), and silicon oxynitride ($SiO_xN_y$).

A top surface (or upper surface) of the second color element 400G and a top surface (or upper surface) of the first inorganic layer 510 may be disposed on the same surface or may be coplanar with each other. The second color element 400G may fill (e.g., entirely fill) the second hole 401-HG of the bank layer 401 and the first opening 510-OP1 of the first inorganic layer 510. In an embodiment, the thickness 400Gt of the second color element 400G may be substantially the same as a sum of the thickness 401*t* of the bank layer 401 and a thickness 510*t* of the first inorganic layer 510.

A second inorganic layer 520 may be disposed on the first inorganic layer 510. The second inorganic layer 520 may overlap the first color element 400R and the second color element 400G. The second inorganic layer 520 may include a third opening 520-OP3 overlapping the third hole 401-HB of the bank layer 401.

A width of the third opening 520-OP3 of the second inorganic layer 520 and a width of the third hole 401-HB of the bank layer 401 may be substantially the same as each other.

The second inorganic layer 520 may include an inorganic insulating material. For example, the second inorganic layer 520 may include the same material as that of the first inorganic layer 510.

A top surface (or upper surface) of the third color element 400B and a top surface (or upper surface) of the second inorganic layer 520 may be disposed on the same surface or may be coplanar with each other. The third color element 400B may fill (e.g., entirely fill) the third hole 401-HB of the bank layer 401, the second opening 510-OP2 of the first inorganic layer 510, and the third opening 520-OP3 of the second inorganic layer 520. In an embodiment, the thickness 400Bt of the third color element 400B may be substantially the same as a sum of the thickness 401*t* of the bank layer 401, the thickness 510*t* of the first inorganic layer 510, and a thickness 520*t* of the second inorganic layer 520.

Each of the first to third color elements 400R, 400G, and 400B may include a color conversion pattern layer or a light-transmitting pattern layer. For example, the first color element 400R may include a first color conversion pattern layer 410R, the second color element 400G may include a second color conversion pattern layer 410G, and the third color element 400B may include a light-transmitting pattern layer 410B.

The first and second color conversion pattern layers 410R and 410G may include quantum dots. For example, the first color conversion pattern layer 410R may include first quantum dots, and the second color conversion pattern layer 410G may include second quantum dots. Quantum dots may be excited by incident light to emit light having a specific wavelength. For example, the first quantum dots of the first color conversion pattern layer 410R may be excited by incident blue light to emit red light having a wavelength longer than that of blue light. The second quantum dots of the second color conversion pattern layer 410G may be excited by incident blue light to emit green light having a wavelength longer than that of blue light.

A core of a quantum dot may be selected from among a group II-VI compound, a group III-V compound, a group IV-VI compound, a group IV element, a group IV compound, and a combination thereof.

The group II-VI compound may be selected from among a binary compound selected from the group consisting of CdSe, CdTe, ZnS. ZnSe, ZnTe, ZnO, HgS, HgSe, HgTe, MgSc, MgS, and a mixture thereof; a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSc, HgZnTe, MgZnSc, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group III-V compound may be selected from among a binary compound selected from the group consisting of GaN, GaP, GaAs, GaSb, AlN, AlP, AlAs, AlSb, InN, InP, InAs, InSb, and a mixture thereof; a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The group IV-VI compound may be selected from among a binary compound selected from the group consisting of SnS, SnSc, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The group IV element may be selected from the group consisting of silicon (Si), germanium (Ge), and a mixture thereof. The group IV compound may be a binary compound selected from the group consisting of SiC, SiGe, and a mixture thereof.

For example, the binary compound, the ternary compound, or the quaternary compound may be included in particles at a uniform concentration, or may be included in the same particle divided into two states where concentration distributions are partially different. For example, the quantum dot may have a core/shell structure in which a quantum dot surrounds another quantum dot. An interface between the core and the shell may have a concentration gradient in which a concentration of an element in the shell gradually decreases toward the center.

In some embodiments, a quantum dot may have a core-shell structure including a core including a nanocrystal and a shell surrounding the core. The shell of the quantum dot may function as a protective layer for maintaining semiconductor characteristics by preventing chemical denaturation of the core and/or a charging layer for giving electrophoretic characteristics to the quantum dot. The shell may have a single structure or a multi-layer structure. An interface between the core and the shell may have a concentration gradient in which a concentration of an element in the shell gradually decreases toward the center. Examples of the shell of the quantum dot may include an oxide of a metal or a non-metal, a semiconductor compound, and a combination thereof.

Examples of the oxide of the metal or the non-metal may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO and a ternary compound such as $MgAl_2O_4$, $CoFe_2O_4$, $NiFe_2O_4$, or $CoMn_2O_4$. However, embodiments are not limited thereto.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb. However, embodiments are not limited thereto.

The light-transmitting pattern layer 410B may include a light-transmitting material. For example, the light-transmitting pattern layer 410B may include an inorganic insulating material having light-transmitting properties such as silicon oxide ($SiO_x$), silicon nitride ($SiN_x$), or silicon oxynitride ($SiO_xN_y$), or an organic insulating material having light-transmitting properties such as polyimide (PI). The light-transmitting pattern layer 410B may further include scattering particles such as $TiO_2$. In some embodiments, the first color conversion pattern layer 410R and/or the second color conversion pattern layer 410B may further include scattering particles such as $TiO_2$.

The first to third color elements 400R, 400G, and 400B may include first to third color filters 420R, 420G, and 420B. For example, the first color element 400R may include the first color filter 420R, the second color element 400G may include the second color filter 420G, and the third color element 400B may include the third color filter 420B.

Each of the first to third color filters 420R, 420G, and 420B may selectively transmit light of a certain color. For example, the first color filter 420R may transmit red light, the second color filter 420G may transmit green light, and the third color filter 420B may transmit blue light.

The first to third color filters 420R, 420G, and 420B may be disposed on the first and second color conversion pattern layers 410R and 410G and the light-transmitting pattern layer 410B. For example, the first color filter 420R may be disposed on the first color conversion pattern layer 410R. The second color filter 420G may be disposed on the second color conversion pattern layer 410G. The third color filter 420B may be disposed on the light-transmitting pattern layer 410B.

For example, top surfaces (or upper surfaces) of the first to third color filters 420R, 420G, and 420B and at least one of a top surface (or upper surface) of the bank layer 401, a top surface (or upper surface) of the first inorganic layer 510, and a top surface (or upper surface) of the second inorganic layer 520 may be disposed on the same surface or may be coplanar with each other. For example, a top surface (or upper surface) of the first color filter 420R and a top surface (or upper surface) of the bank layer 401 may be disposed on the same surface or may be coplanar with each other. A top surface (or upper surface) of the second color filter 420G and a top surface (or upper surface) of the first inorganic layer 510 may be disposed on the same surface or may be coplanar with each other. A top surface (or upper surface) of the third color filter 420B and a top surface (or upper surface) of the second inorganic layer 520 may be disposed on the same surface or may be coplanar with each other.

Light emitted from the first to third light-emitting devices LED1, LED2, and LED3 may pass through the first to third color elements 400R, 400G, and 400B to be converted into light of a specific color or to be emitted as light of a certain color with maintaining its original color. For example, the first to third light-emitting devices LED1, LED2, and LED3 may emit blue light, and light emitted by passing through the first color element 400R may be red light, light emitted by passing through the second color element 400G may be green light, and light emitted by passing through the third color element 400B may be blue light.

In an embodiment, the first color conversion pattern layer 410R of the first color element 400R may include quantum dots excited by blue light to emit red light. The first color filter 420R of the first color element 400R may include a material that transmits only red light. The second color conversion pattern layer 410G of the second color element 400G may include quantum dots excited by blue light to emit green light. The second color filter 420G of the second color element 400G may include a material that transmits only green light. The light-transmitting pattern layer 410B of the third color element 400B may include a light-transmitting material, and the third color filter 420B may include material that transmits only blue light.

Blue light emitted from the first light-emitting device LED1 may excite the quantum dots of the first color conversion pattern layer 410R to emit red light. The red light emitted by the quantum dots of the first color conversion pattern layer 410R may pass through the first color filter 420R. Blue light passing through the first color conversion pattern layer 410R without exciting the quantum dots may not pass through the first color filter 420R. Accordingly, light emitted by passing through the first color element 400R may be red light.

Blue light emitted from the second light-emitting device LED2 may excite the quantum dots of the second color conversion pattern layer 410G to emit green light. The green light emitted by the quantum dots of the second color conversion pattern layer 410G may pass through the second color filter 420G. Blue light passing through the second color conversion pattern layer 410G without exciting the quantum dots may not pass through the second color filter 420G. Accordingly, light emitted by passing through the second color element 400G may be green light.

Blue light emitted from the third light-emitting device LED3 may pass through both the light-transmitting pattern layer 410B and the third color filter 420B. Accordingly, light emitted by passing through the third color element 400B may be blue light.

Although each of the first to third light-emitting devices LED1, LED2, and LED3 includes an organic emission layer in FIG. 4 and a subsequent process, embodiments are not limited thereto. In another example, each of the first to third light-emitting devices LED1, LED2, and LED3 may include an emission layer including an inorganic material.

FIGS. 5A, 5B, 5C, 5D, 5E, 5F, 5G, 5H, 5I, and 5J are schematic cross-sectional views illustrating a state according to a manufacturing process according to an embodiment.

Figure 5A:
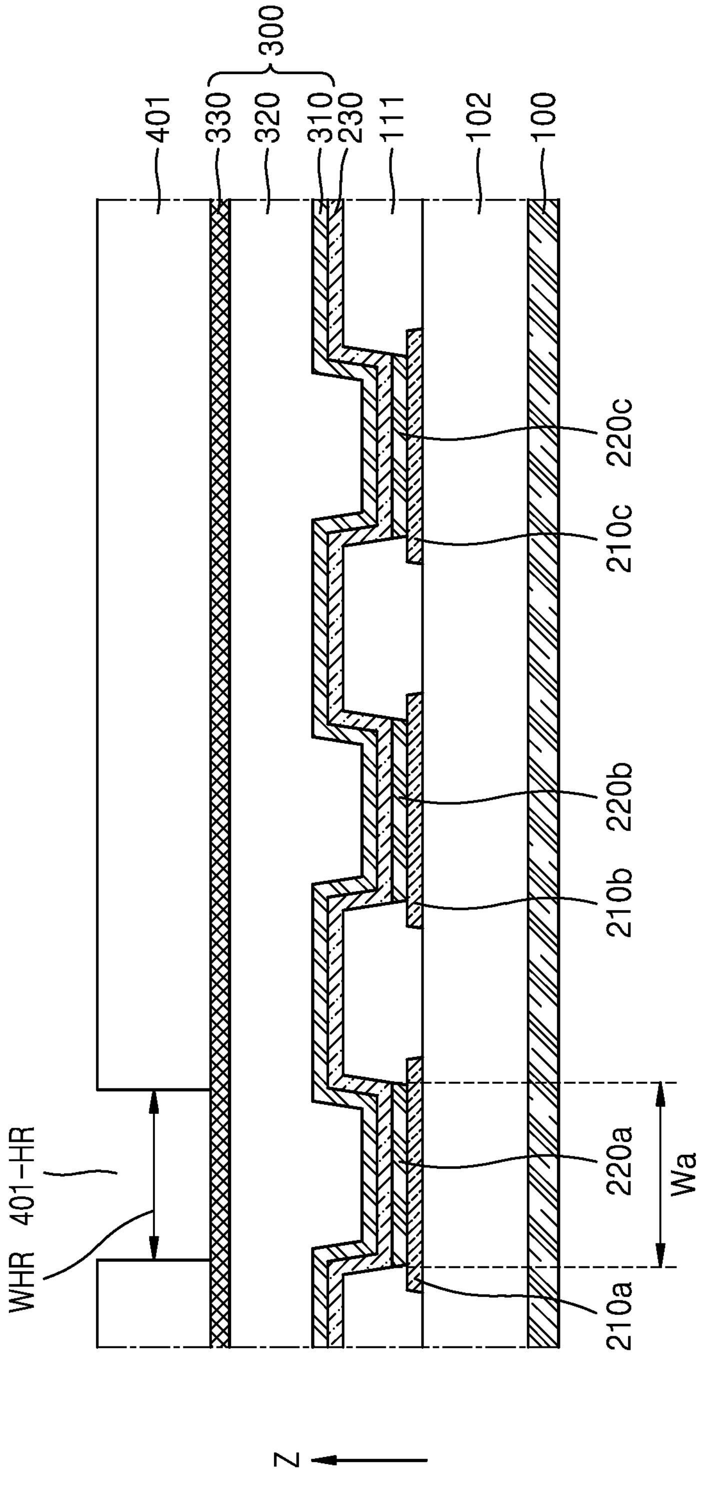
FIGS. 5A, 5B, 5C, 5D, 5E, 5F, 5G, 5H, 5I, and 5J are schematic cross-sectional views illustrating a state according to a manufacturing process according to an embodiment.

Referring to FIG. 5A, the bank layer 401 may be formed on the encapsulation layer 300. The bank layer 401 may include the first hole 401-HR overlapping the first light-emitting device LED1. The first hole 401-HR may be formed by an anisotropic etching process. For example, the first hole 401-HR may be formed by an anisotropic dry etching process by using a hard mask or a photoresist mask. The first hole 401-HR may be a penetration-hole passing through the bank layer 401.

A width WHR of the first hole 401-HR may be equal to or greater than a width Wa of an opening of the sub-pixel defining layer 111 corresponding to the first light-emitting device LED1. The opening of the sub-pixel defining layer 111 may define an emission area of the first light-emitting device LED1. The width WHR of the first hole 401-HR may be equal to or greater than a width of the emission area of the first light-emitting device LED1.

Figure 5B:
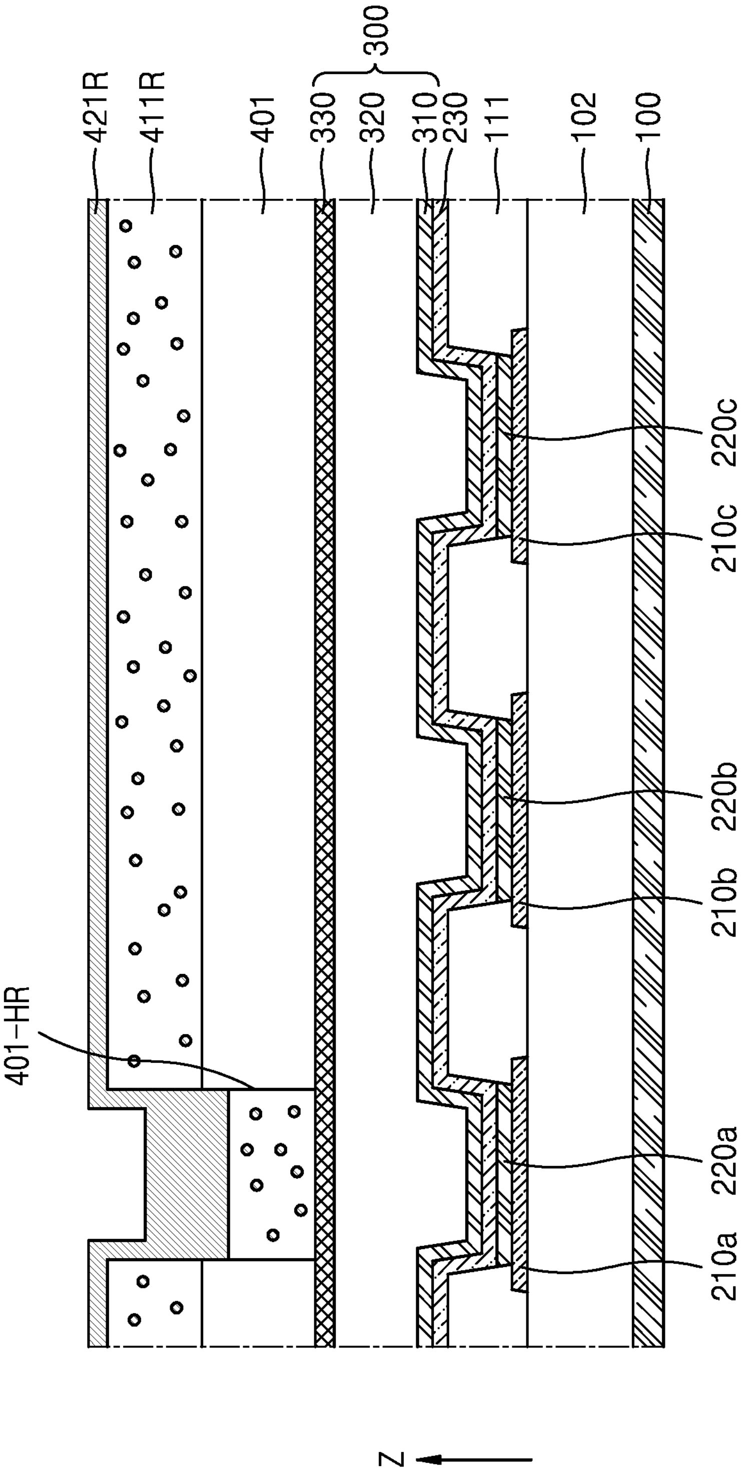

Referring to FIG. 5B, a first color element forming layer including a first color conversion layer 411R and a first color filter layer 421R may be formed on the bank layer 401 and/or the encapsulation layer 300. The first color filter layer 421R may be disposed on the first color conversion layer 411R. A thickness of the first color conversion layer 411R may be greater than a thickness of the first color filter layer 421R.

A part of the first color conversion layer 411R may be disposed in the first hole 401-HR of the bank layer 401. A part of the first color filter layer 421R may be disposed in the first hole 401-HR of the bank layer 401.

The first color conversion layer 411R and the first color filter layer 421R may be formed by applying (or depositing) a resin over an entire surface, and exposing and curing the resin. For example, after a resin for forming the first color conversion layer 411R is applied, exposed, and cured on the bank layer 401 and/or the encapsulation layer 300, a resin for forming the first color filter layer 421R may be applied, exposed, and cured on the first color conversion layer 411R.

The first color conversion layer 411R may include quantum dots. For example, the first color conversion layer 411R may include first quantum dots excited by blue light to emit red light. The first color conversion layer 411R may further include scattering particles. The first color filter layer 421R may transmit only light of a certain color. For example, the first color filter layer 421R may transmit red light, thereby improving color purity.

Figure 5C:
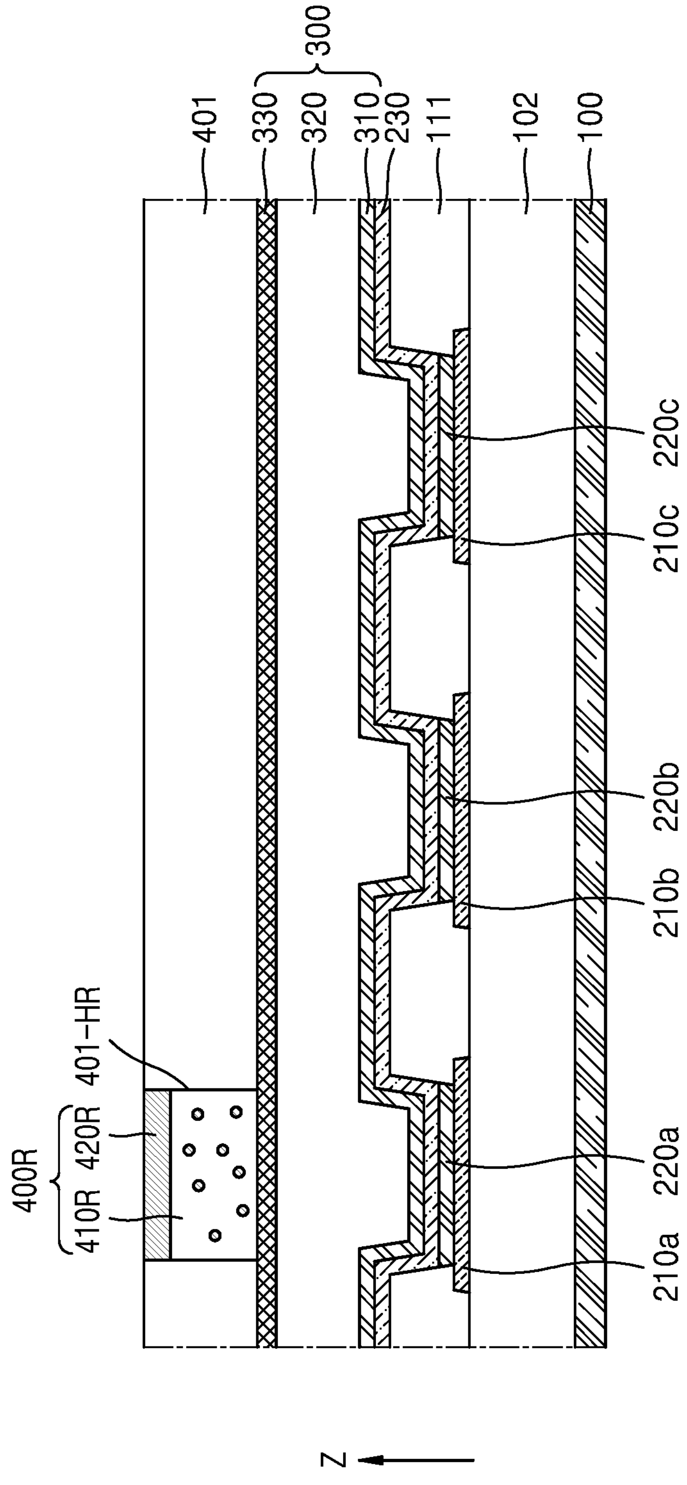

Referring to FIG. 5C, portions of the first color conversion layer 411R (see FIG. 5B) and the first color filter layer 421R (see FIG. 5B) disposed outside the first hole 401-HR of the bank layer 401 may be removed. For example, a portion disposed outside the first hole 401-HR may be planarized to be removed (e.g., to be completely removed). For example, a portion disposed on a top surface (or upper surface) of the bank layer 401 may be removed (e.g., completely removed). The above removing may be performed by using a chemical mechanical polishing (CMP) process.

Portions of the first color conversion layer 411R (see FIG. 5B) and the first color filter layer 421R (see FIG. 5B) remaining in the first hole 401-HR may be respectively the first color conversion pattern layer 410R and the first color filter 420R. A top surface (or upper surface) of the first color filter 420R and a top surface (or upper surface) of the bank layer 401 may be disposed on the same surface or may be coplanar with each other.

Figure 5D:
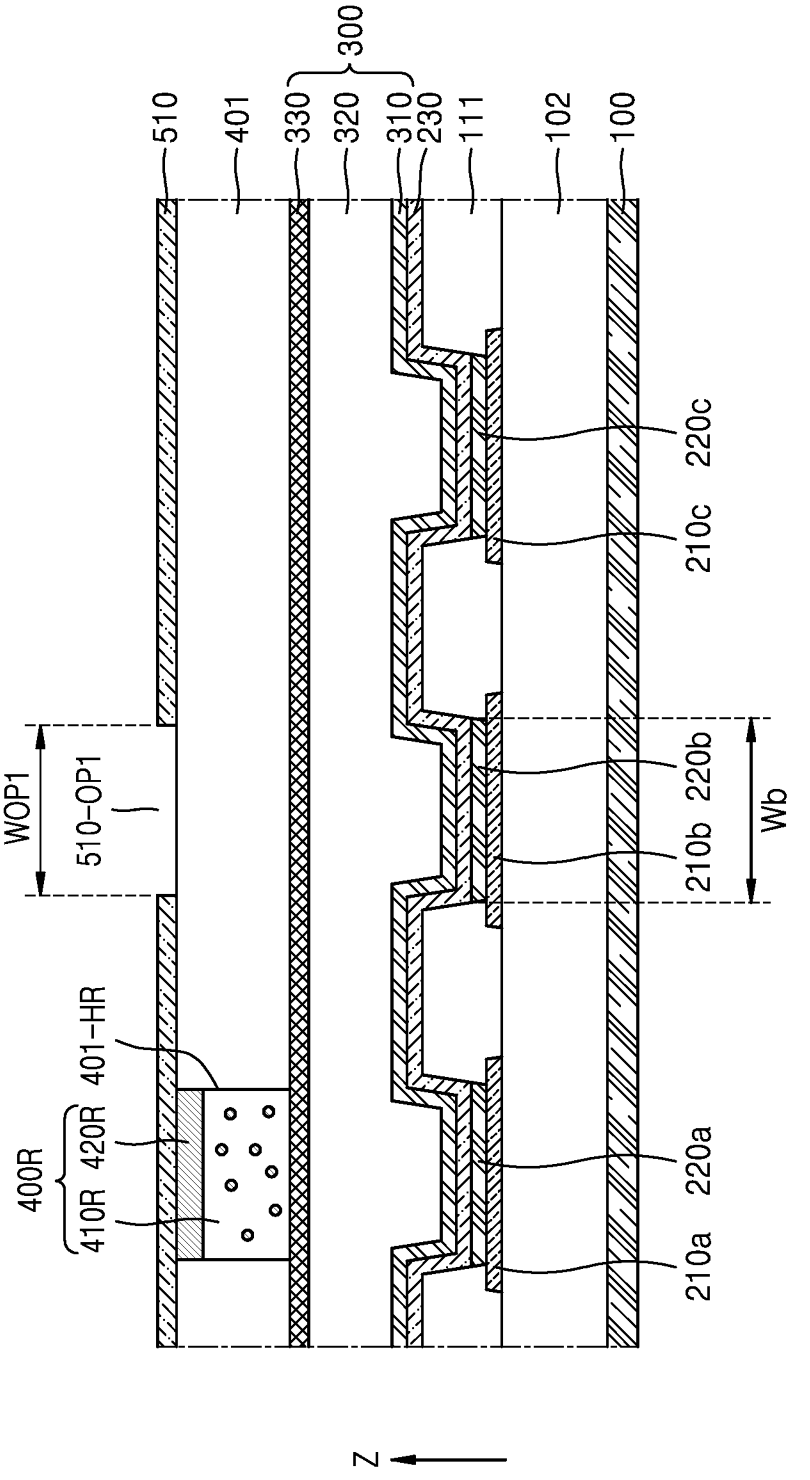

Referring to FIG. 5D, the first inorganic layer 510 may be formed on the bank layer 401. The first inorganic layer 510 may overlap the first color element 400R.

The first inorganic layer 510 may include the first opening 510-OP1 overlapping the second light-emitting device LED2. A width WOP1 of the first opening 510-OP1 may be equal to or greater than a width Wb of an opening of the sub-pixel defining layer 111 corresponding to the second light-emitting device LED2. The opening of the sub-pixel defining layer 111 may define an emission area of the second light-emitting device LED2. A width WOP1 of the first opening 510-OP1 of the first inorganic layer 510 may be equal to or greater than a width of the emission area of the second light-emitting device LED2. The first opening 510-OP1 may be formed by an anisotropic dry etching process by using a photoresist as a mask.

Figure 5E:
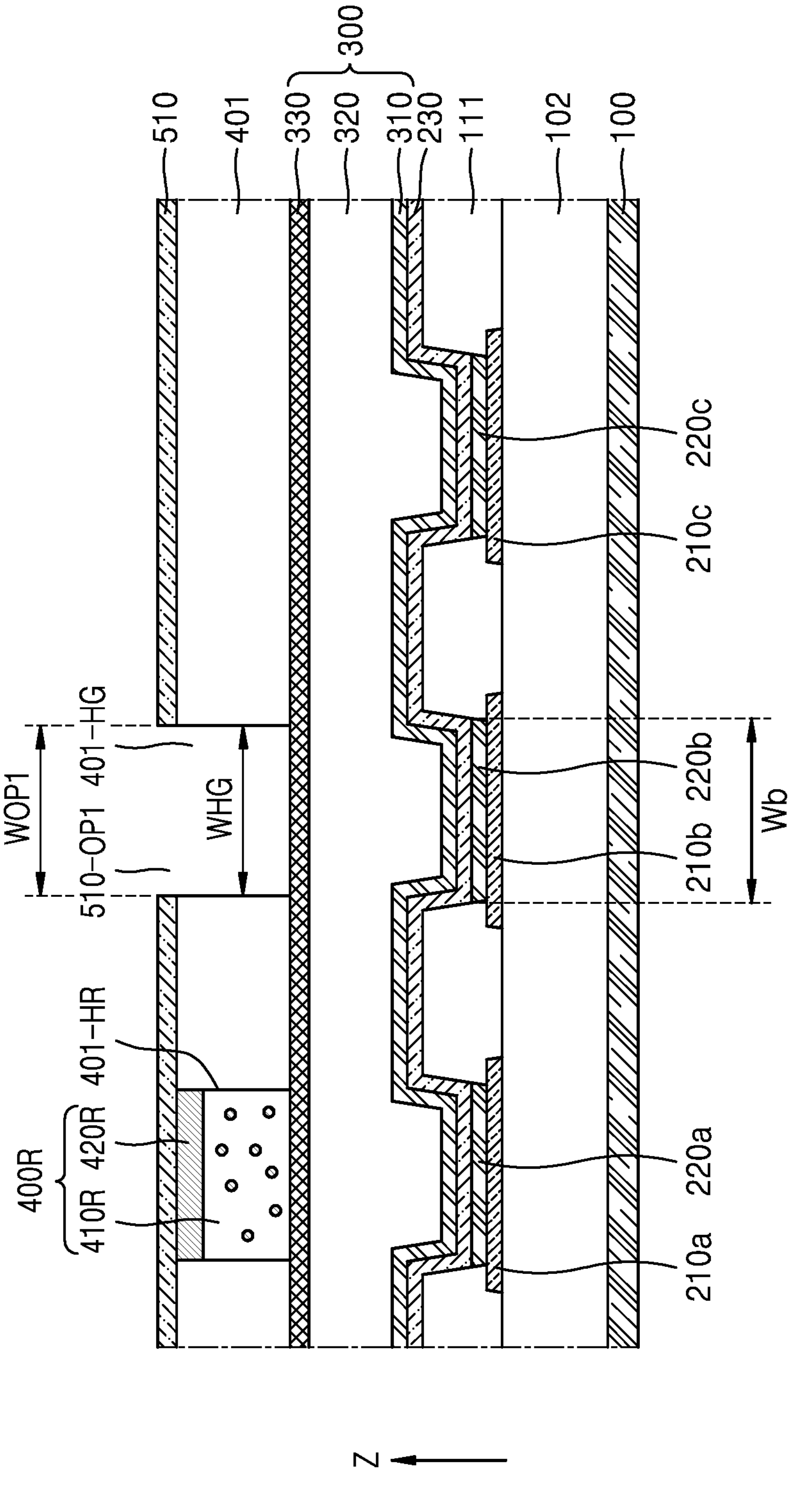

Referring to FIG. 5E, the second hole 401-HG may be formed in the bank layer 401. The second hole 401-HG may overlap the second light-emitting device LED2 and the first opening 510-OP1 of the first inorganic layer 510. The second hole 401-HG may be formed by an anisotropic etching process. For example, the second hole 401-HG may be formed by an anisotropic dry etching process by using the first inorganic layer 510 as a hard mask. The second hole 401-HG may be a penetration-hole passing through the bank layer 401.

A width WHG of the second hole 401-HG may be equal to or greater than the width Wb of the opening of the sub-pixel defining layer 111 corresponding to the second light-emitting device LED2. The width WHG of the second hole 401-HG may be equal to or greater than a width of the emission area of the second light-emitting device LED2. In an embodiment, the width WHG of the second hole 401-HG of the bank layer 401 and the width WOP1 of the first opening 510-OP1 of the first inorganic layer 510 may be substantially the same as each other.

Figure 5F:
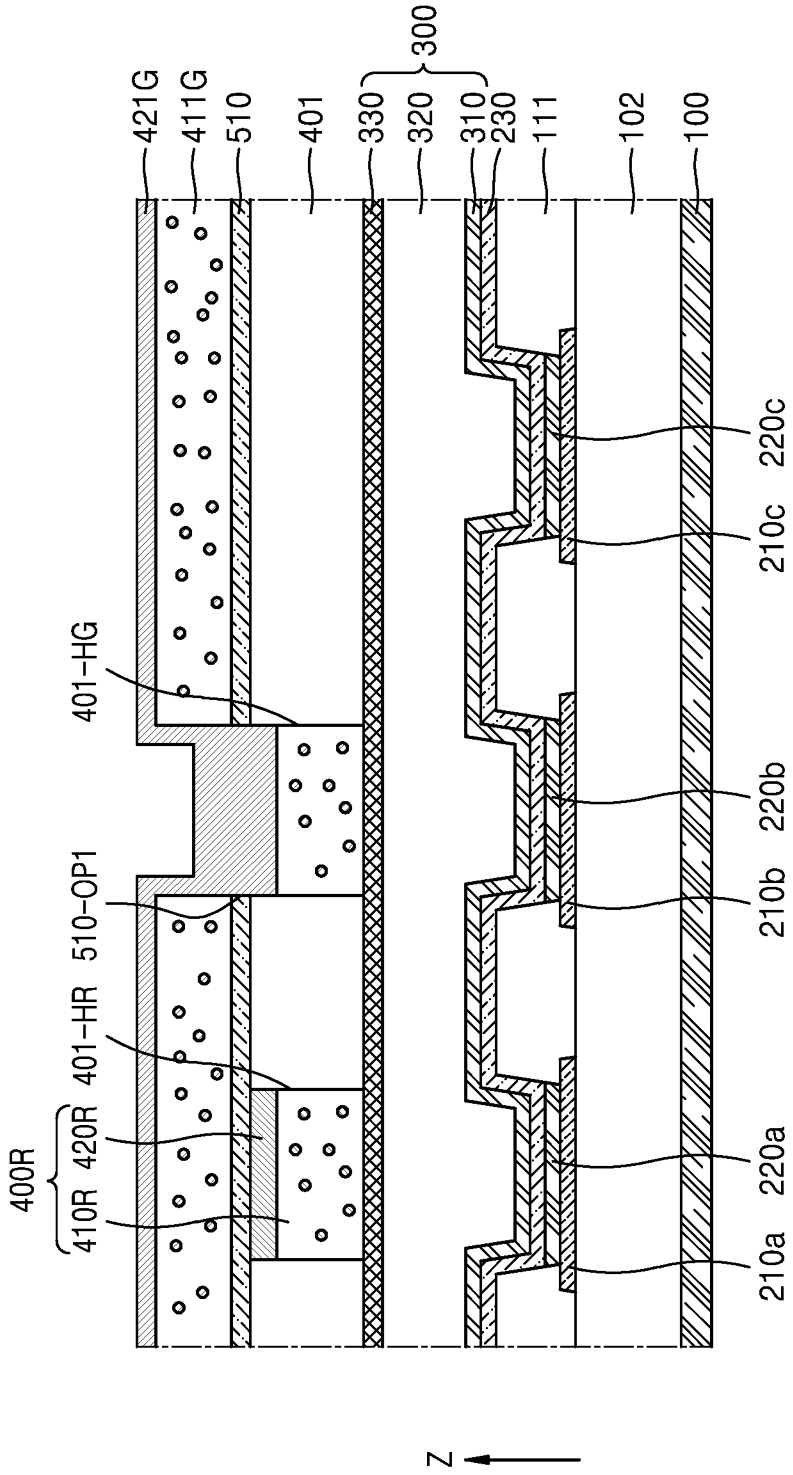

Referring to FIG. 5F, a second color element forming layer including a second color conversion layer 411G and a second color filter layer 421G may be formed on an embodiment of FIG. 5E. The second color filter layer 421G may be disposed on the second color conversion layer 411G. A thickness of the second color conversion layer 411G may be greater than a thickness of the second color filter layer 421G.

A part of the second color conversion layer 411G may be disposed in the second hole 401-HG of the bank layer 401. A part of the second color filter layer 421G may be disposed in the second hole 401-HG of the bank layer 401.

The second color conversion layer 411G and the second color filter layer 421G may be formed by applying a resin over an entire surface, and exposing and curing the resin. For example, after a resin for forming the second color conversion layer 411G is applied, exposed, and cured on the first inorganic layer 510, the bank layer 401, and/or the encapsulation layer 300, a resin for forming the second color filter layer 421G may be applied, exposed, and cured.

The second color conversion layer 411G may include quantum dots. For example, the second color conversion layer 411G may include quantum dots excited by blue light to emit green light. The second color conversion layer 411G may further include scattering particles. The second color filter layer 421G may transmit only light of a certain color. For example, the second color filter layer 421G may transmit green light, thereby improving color purity.

Figure 5G:
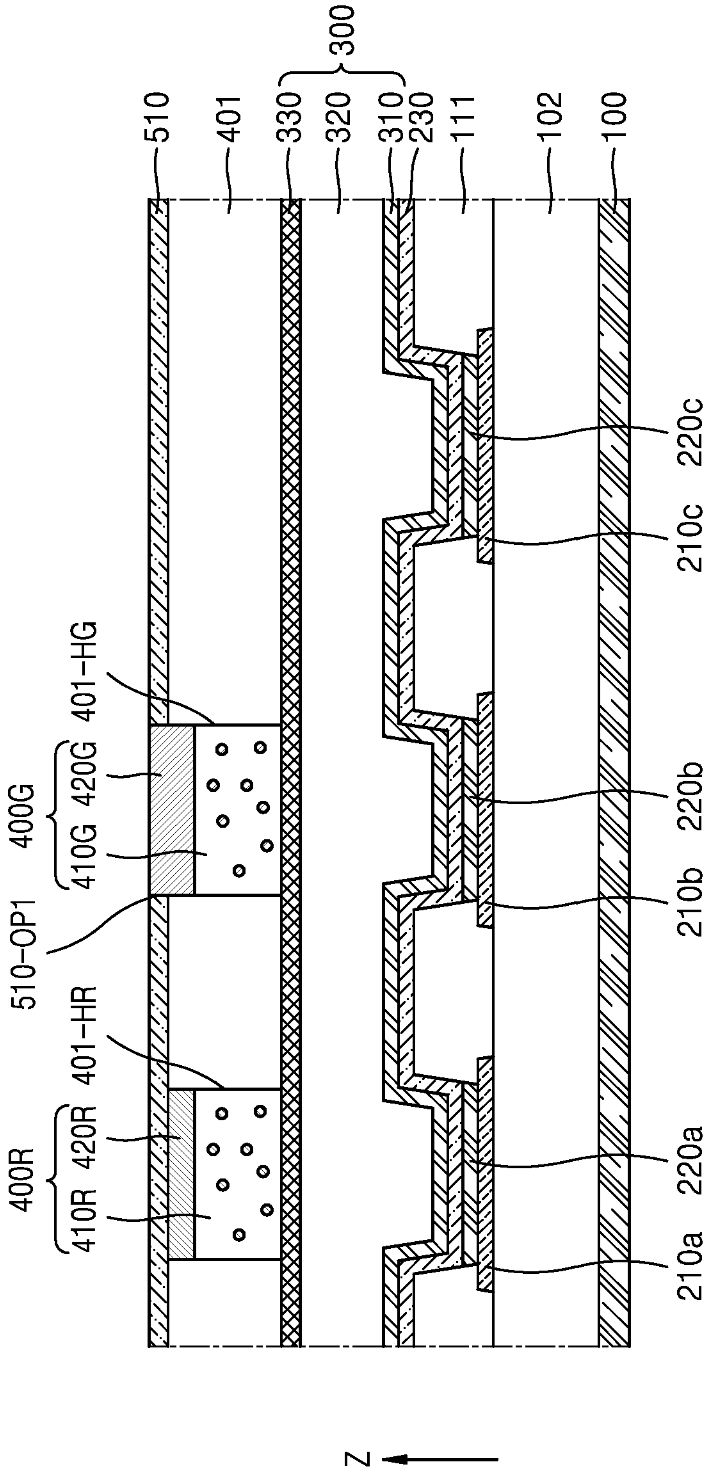

Referring to FIG. 5G, portions of the second color conversion layer 411G (see FIG. 5F) and the second color filter layer 421G (see FIG. 5F) disposed outside the second hole 401-HG of the bank layer 401 and the first opening 510-OP1 of the first inorganic layer 510 may be removed. For example, a portion disposed outside the second hole 401-HG and the first opening 510-OP1 may be planarized to be removed (e.g., to be completely removed). For example, a portion disposed on a top surface (or upper surface) of the first inorganic layer 510 may be removed (e.g., completely removed). The above removing may be performed by using a chemical mechanical polishing (CMP) process.

Portions of the second color conversion layer 411G (see FIG. 5F) and the second color filter layer 421G (see FIG. 5F) remaining in the second hole 401-HG and the first opening 510-OP1 may be respectively the second color conversion pattern layer 410G and the second color filter 420G. A top surface (or upper surface) of the second color filter 420G and a top surface (or upper surface) of the first inorganic layer 510 may be disposed on the same surface or may be coplanar with each other.

Figure 5H:
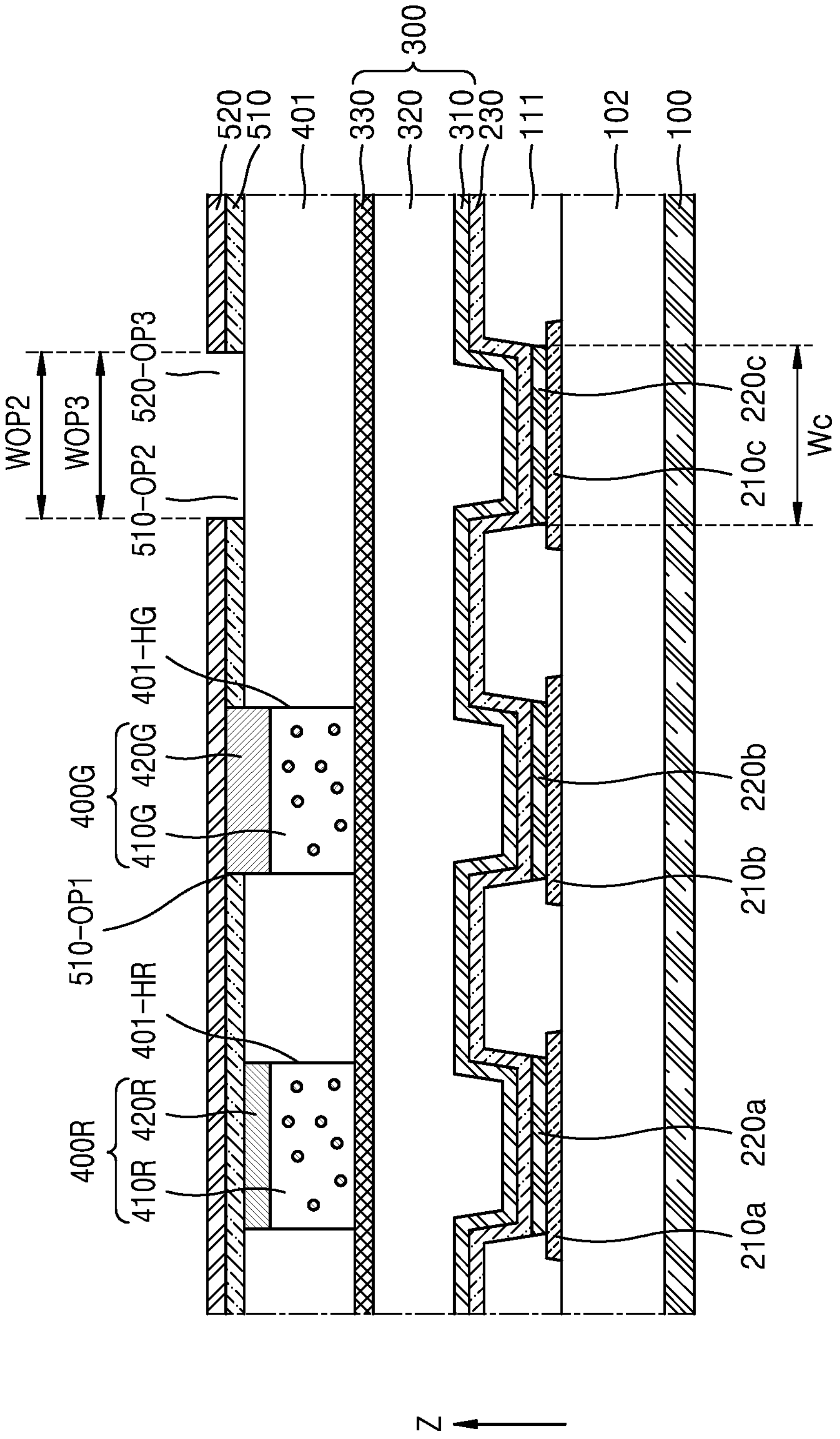

Referring to FIG. 5H, the second inorganic layer 520 may be formed on the first inorganic layer 510. The second inorganic layer 520 may overlap the first color element 400R and the second color element 400G.

The first inorganic layer 510 may include the second opening 510-OP2 overlapping the third light-emitting device LED3. A width WOP2 of the second opening 510-OP2 may be equal to or greater than a width Wc of an opening of the sub-pixel defining layer 111 corresponding to the third light-emitting device LED3. For example, the width WOP2 of the second opening 510-OP2 may be equal to or greater than a width of an emission area of the third light-emitting device LED3.

The second inorganic layer 520 may include the third opening 520-OP3 overlapping the third light-emitting device LED3 and the second opening 510-OP2. A width WOP3 of the third opening 520-OP3 may be equal to or greater than the width Wc of the opening of the sub-pixel defining layer 111 corresponding to the third light-emitting device LED3. For example, the width WOP3 of the third opening 520-OP3 may be equal to or greater than a width of the emission area of the third light-emitting device LED3.

The width WOP2 of the second opening 510-OP2 and the width WOP3 of the third opening 520-OP-3 may be substantially the same as each other.

The second opening 510-OP2 and the third opening 520-OP3 may be formed by an anisotropic dry etching process by using a photoresist as a mask. The second opening 510-OP2 and the third opening 520-OP3 may be simultaneously formed.

Figure 5I:
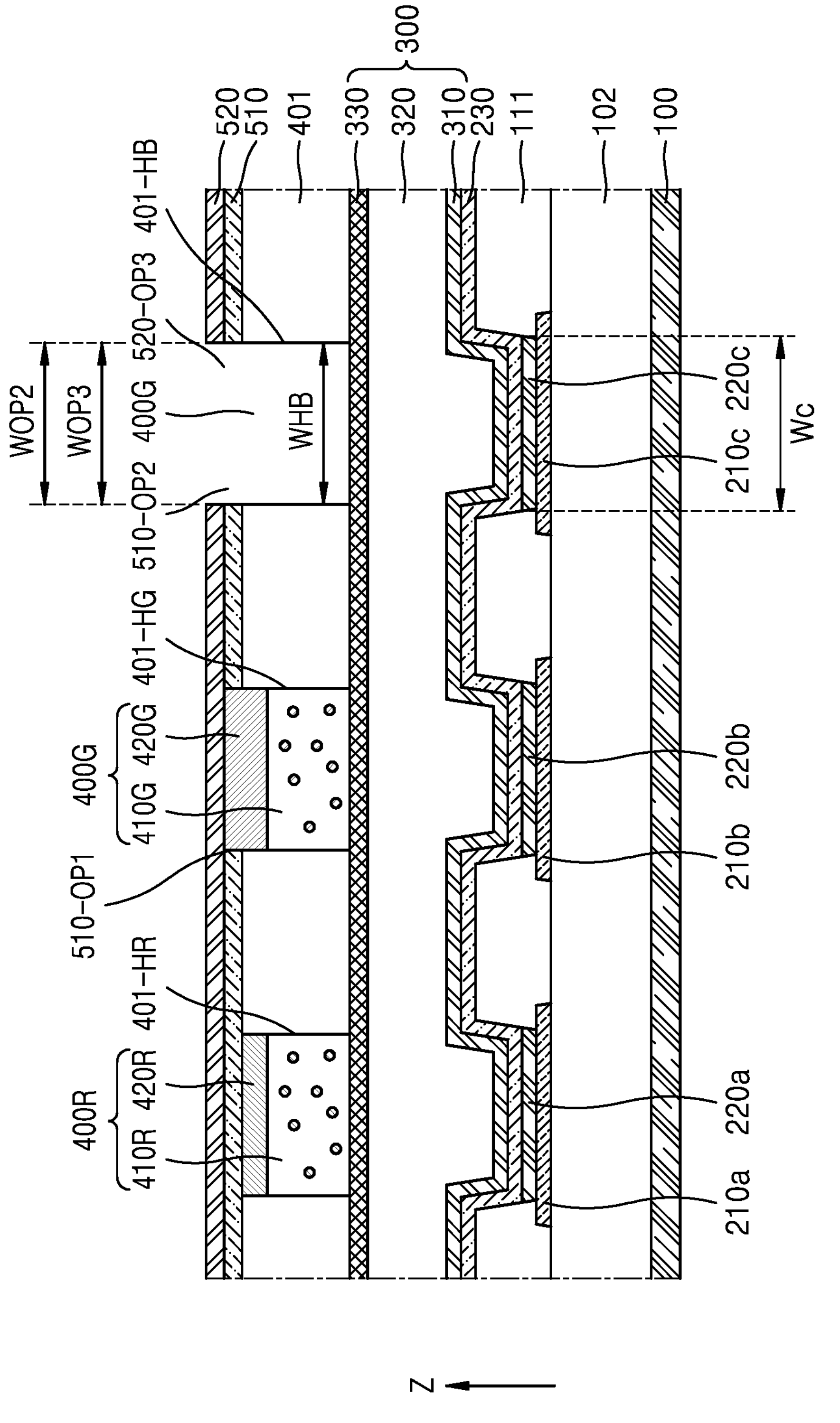

Referring to FIG. 5I, the third hole 401-HB may be formed in the bank layer 401. The third hole 401-HB may overlap the third light-emitting device LED3, the second opening 510-OP2 of the first inorganic layer 510, and the third opening 520-OP3 of the second inorganic layer 520. The third hole 401-HB may be formed by an anisotropic etching process. For example, the third hole 401-HB may be formed by an anisotropic dry etching process by using the second inorganic layer as a hard mask. The third hole 401-HB may be a penetration-hole passing through the bank layer 401.

A width WHB of the third hole 401-HB may be equal to or greater than a width Wc of an opening of the sub-pixel defining layer 111 corresponding to the third light-emitting device LED3. For example, a width WHB of the third hole 401-HB may be equal to or greater than a width of the emission area of the third light-emitting device LED3. In an embodiment, the width WHB of the third hole 401-HB of the bank layer 401, the width WOP2 of the second opening 510-OP2 of the first inorganic layer 510, and the width WOP3 of the third opening 520-OP3 of the second inorganic layer 520 may be substantially the same as each other.

Figure 5J:
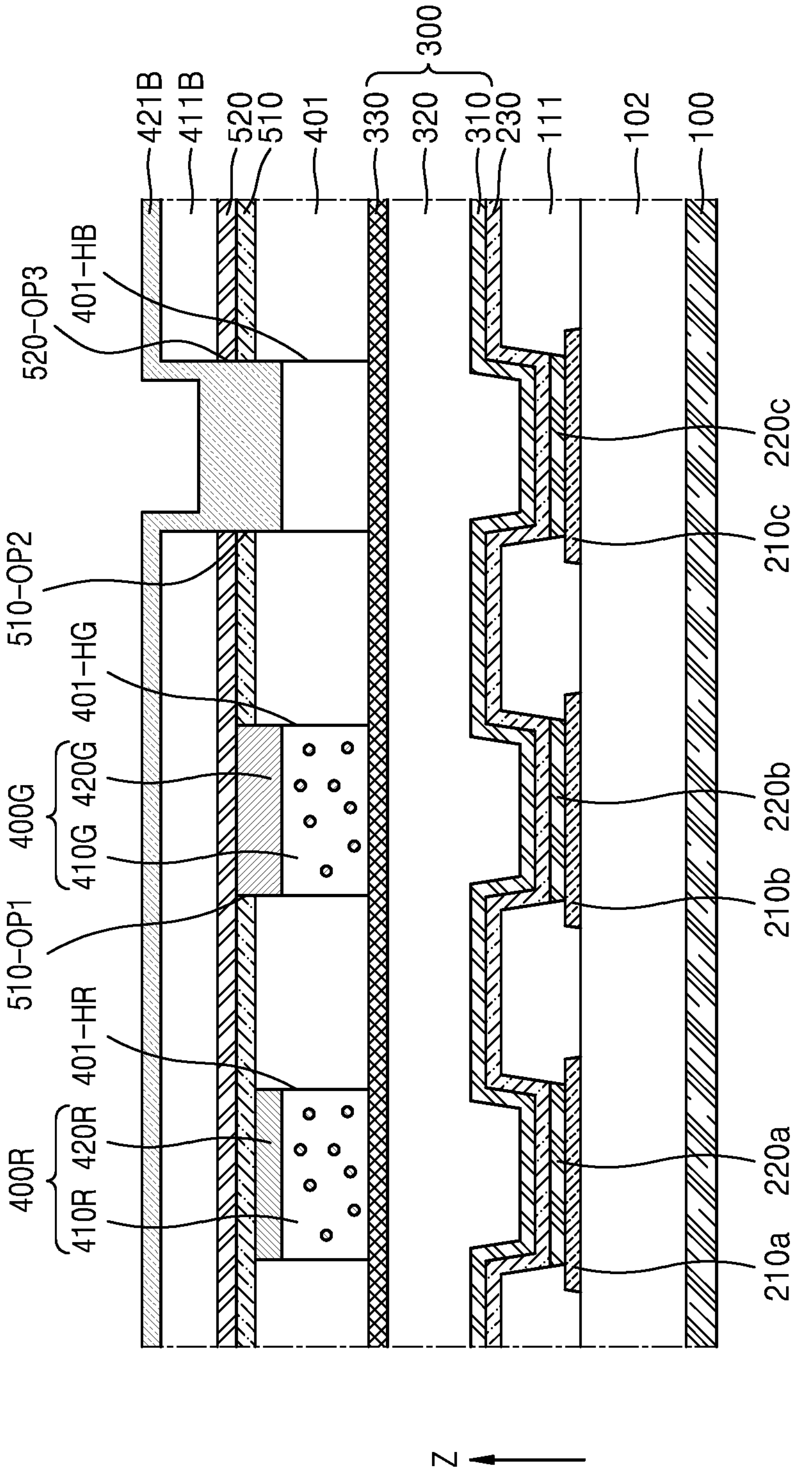

Referring to FIG. 5J, a third color element forming layer including a light-transmitting layer 411B and a third color filter layer 421B may be formed on the second inorganic layer 520, the first inorganic layer 510, the bank layer 401, and/or the encapsulation layer 300. The third color filter layer 421B may be disposed on the light-transmitting layer 411B. A thickness of the light-transmitting layer 411B may be greater than a thickness of the third color filter layer 421B.

A part of the light-transmitting layer 411B may be disposed in the third hole 401-HB of the bank layer 401. A part of the third color filter layer 421B may be disposed in the third hole 401-HB of the bank layer 401.

The light-transmitting layer 411B and the third color filter layer 421B may be formed by applying a resin over an entire surface, and exposing and curing the resin. For example, after a resin for forming the light-transmitting layer 411B is applied, exposed, and cured on the second inorganic layer 520, the first inorganic layer 510, the bank layer 401, and/or the encapsulation layer 300, a resin for forming the third color filter layer 421B may be applied, exposed, and cured on the light-transmitting layer 411B.

The light-transmitting layer 411B may include a light-transmitting material. The third color filter layer 421B may transmit only light of a certain color. For example, the third color filter layer 421B may transmit only blue light.

For example, portions of the light-transmitting layer 411B and the third color filter layer 421B disposed outside the third hole 401-HB of the bank layer 401, the second opening 510-OP2 of the first inorganic layer 510, and the third opening 520-OP3 of the second inorganic layer 520 may be removed, to form the embodiment of FIG. 4. For example, a portion disposed outside the third hole 401-HB, the second opening 510-OP2, and the third opening 520-OP3 may be planarized to be removed (e.g., to be completely removed), and may form the embodiment of FIG. 4. The above removing may be performed by using a chemical mechanical polishing (CMP) process.

Figure 6:
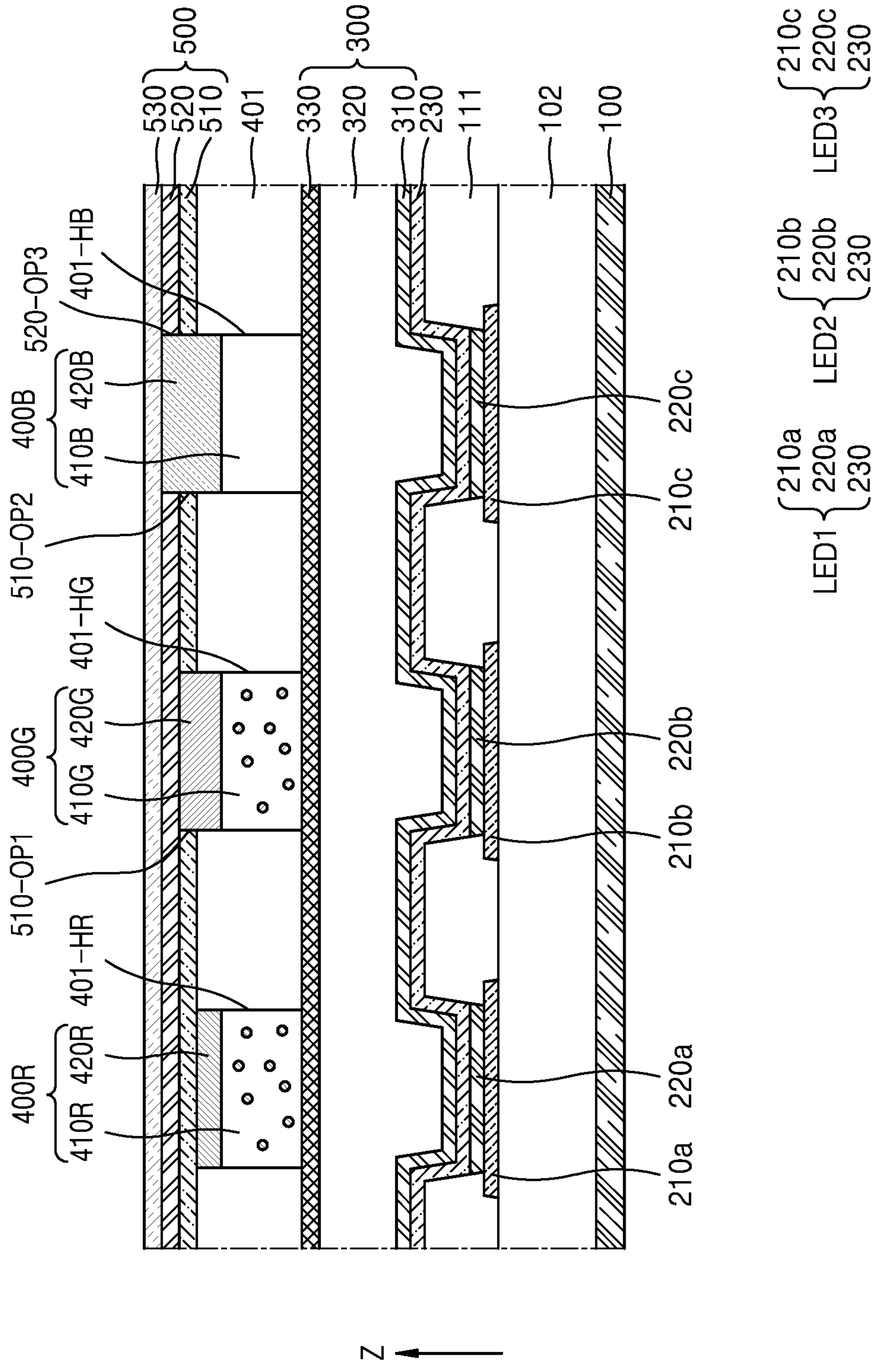
FIGS. 6, 7, and 8 are schematic cross-sectional views illustrating a part of a display apparatus according to an embodiment.
Figure 7:
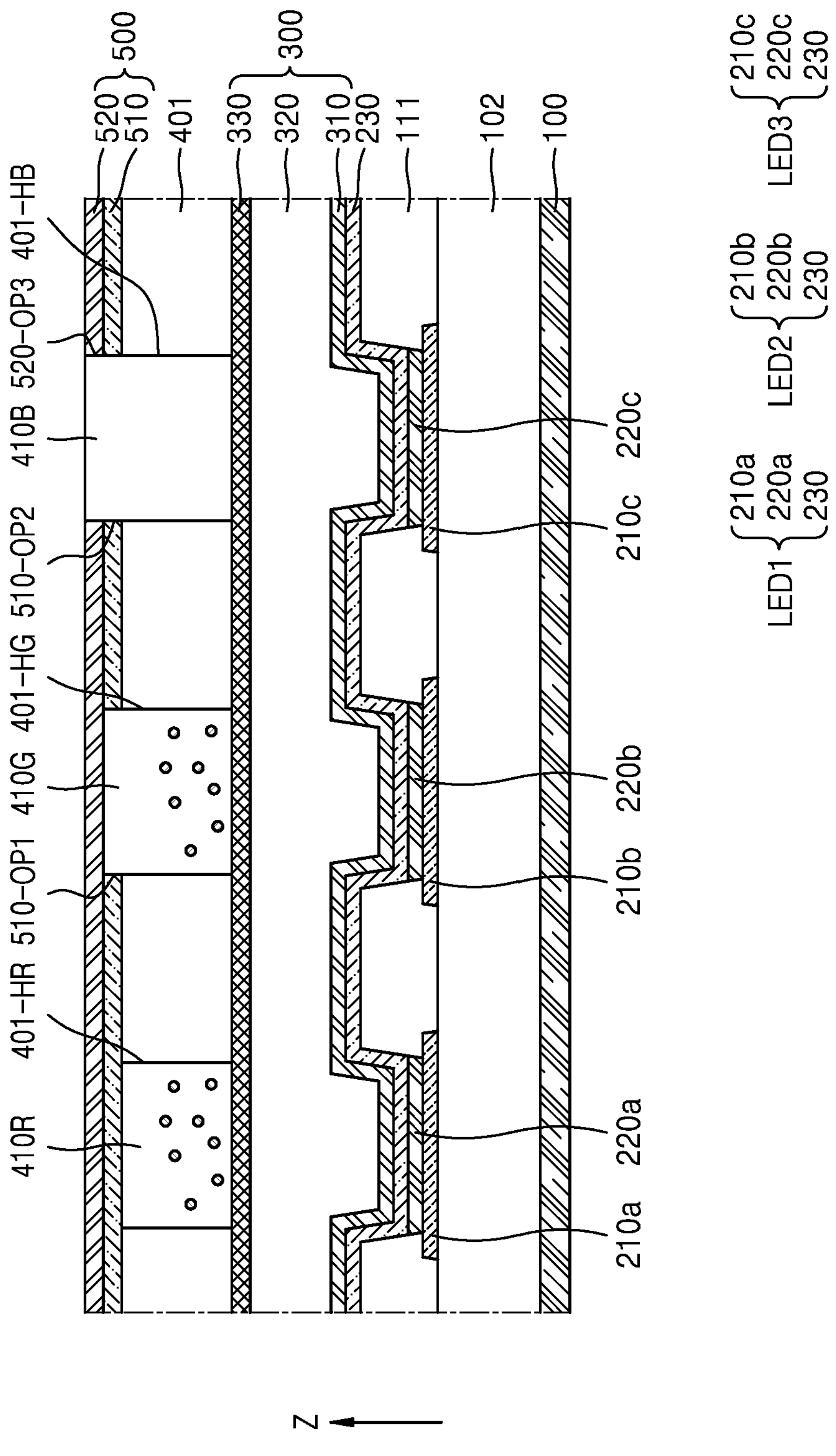
Figure 8:
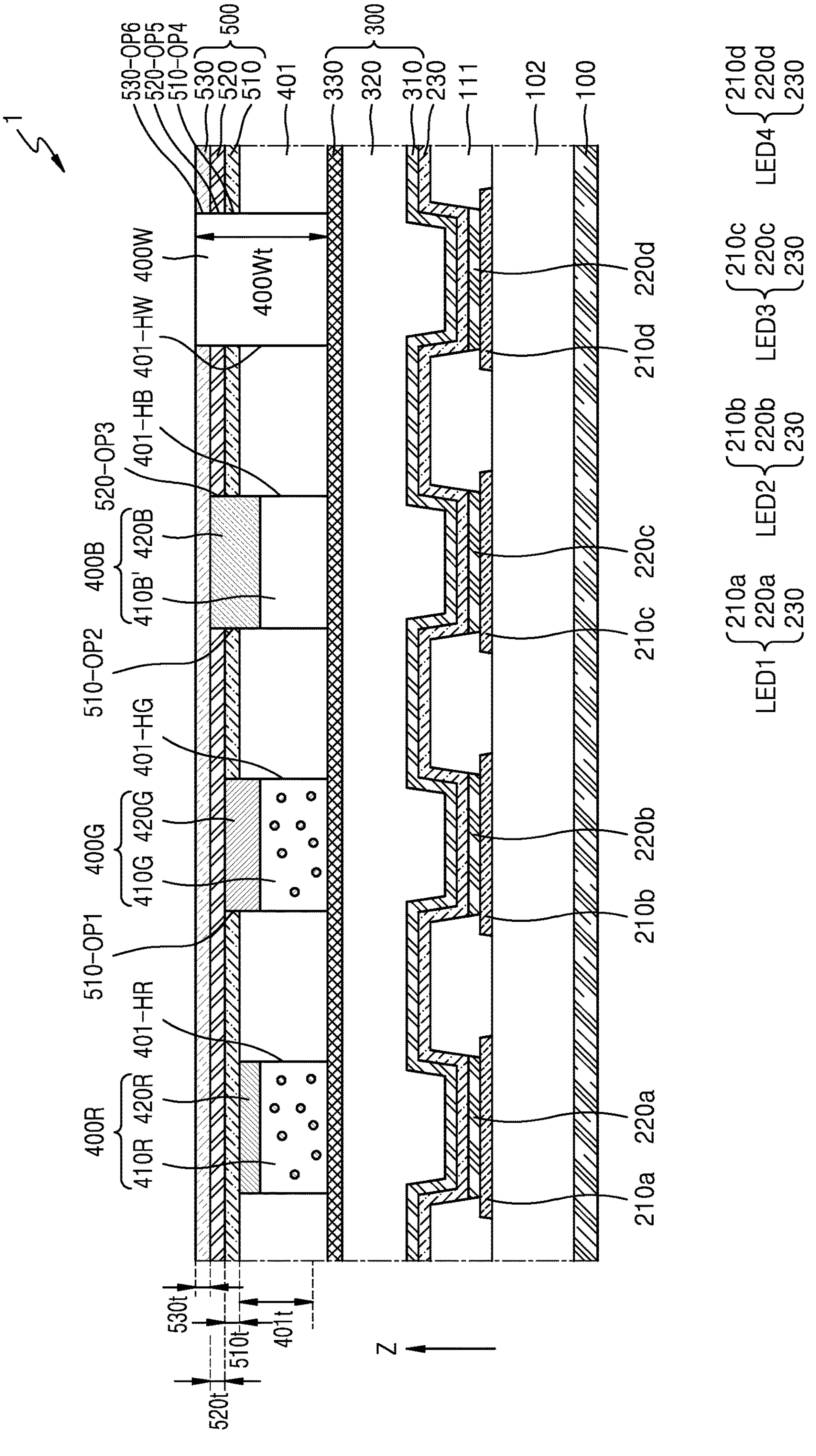

FIGS. 6, 7, and 8 are schematic cross-sectional views illustrating a part of a display apparatus according to an embodiment.

Referring to FIG. 6, a third inorganic layer 530 may be further provided on an embodiment of FIG. 4.

The third inorganic layer 530 may be disposed on the second inorganic layer 520. The third inorganic layer 530 may overlap the first color element 400R, the second color element 400G, and the third color element 400B.

The third inorganic layer 530 may include an inorganic insulating material. For example, the third inorganic layer 530 may include at least one inorganic insulating material among silicon oxide ($SiO_x$), silicon nitride ($SiN_x$), and silicon oxynitride ($SiO_xN_y$). In an embodiment, the first inorganic layer 510, the second inorganic layer 520, and the third inorganic layer 530 may include the same inorganic insulating material.

Referring to FIG. 7, characteristics other than a color element are the same as those described with reference to FIG. 4, and thus, a difference will be mainly described.

The first color conversion pattern layer 410R, the second color conversion pattern layer 410G, and the light-transmitting pattern layer 410B may be respectively disposed in the first hole 401-HR, the second hole 401-HG, and the third hole 401-HB of the bank layer 401. For example, the first color conversion pattern layer 410R may be disposed in the first hole 401-HR. At least a part of the second color conversion pattern layer 410G may be disposed in the second hole 401-HG. At least a part of the light-transmitting pattern layer 410B may be disposed in the third hole 401-HB.

A top surface (or upper surface) of the first color conversion pattern layer 410R and a top surface (or upper surface) of the bank layer 401 may be disposed on the same surface or may be coplanar with each other. A top surface (or upper surface) of the second color conversion pattern layer 410G and a top surface (or upper surface) of the first inorganic layer 510 may be disposed on the same surface or may be coplanar with each other. A top surface (or upper surface) of the light-transmitting pattern layer 410B and a top surface (or upper surface) of the second inorganic layer 520 may be disposed on the same surface or may be coplanar with each other.

Unlike in the embodiment of FIG. 4, a color filter may not be disposed in the first to third holes 401-HR, 401-HG, and 401-HB of the bank layer 401.

Referring to FIG. 8, the display apparatus 1 may include a fourth light-emitting device LED4 and a configuration corresponding to the fourth light-emitting device LED4.

A fourth sub-pixel electrode 210*d* may be disposed on the driving circuit layer 102. Characteristics of the fourth sub-pixel electrode 210*d* are the same as those of the first to third sub-pixel electrodes 210*a*, 210*b*, and 210*c* described with reference to FIG. 4.

The sub-pixel defining layer 111 may be disposed on the driving circuit layer 102. The sub-pixel defining layer 111 may cover edge portions (or edges) of the first to fourth sub-pixel electrodes 210*a*, 210*b*, 210*c*, and 210*d*. The sub-pixel defining layer 111 may include openings through which parts of the first to fourth sub-pixel electrodes 210*a*, 210*b*, 210*c*, and 210*d* are exposed. The openings of the sub-pixel defining layer 111 may correspond to areas where light of the first to fourth light-emitting devices LED1, LED2, LED3, and LED4 is emitted, and may define emission areas of the first to fourth light-emitting devices LED1, LED2, LED3, and LED4.

A fourth intermediate layer 220*d* may be disposed on the fourth sub-pixel electrode 210*d*. The fourth intermediate layer 220*d* may include an organic emission layer (EML) including a low molecular weight material or a high molecular weight material. The fourth intermediate layer 220*d* may have a single structure or a multi-layer structure including a hole injection layer (HIL), a hole transport layer (HTL), the organic emission layer (EML), an electron transport layer (ETL), and/or an electron injection layer (EIL).

A stacked structure of the fourth sub-pixel electrode 210*d*, the fourth intermediate layer 220*d*, and the counter electrode 230 may constitute (or form) the fourth light-emitting device LED4.

The bank layer 401 may include a fourth hole 401-HW overlapping the fourth light-emitting device LED4. The fourth hole 401-HW may be a penetration-hole penetrating the bank layer 401. For example, a part of a top surface (or upper surface) of the encapsulation layer 300 may be exposed through the fourth hole 401-HW of the bank layer 401.

The first inorganic layer 510 may include a fourth opening 510-OP4 overlapping the fourth hole 401-HW. The second inorganic layer 520 may include a fifth opening 520-OP5 overlapping the fourth hole 401-HW. The third inorganic layer 530 may include a sixth opening 530-OP6 overlapping the fourth hole 401-HW. Widths of the fourth hole 401-HW, the fourth hole 510-OP4, the fifth hole 520-OP5, and the sixth hole 530-OP6 may be substantially the same as each other.

At least a part of a fourth color element 400W may be disposed in the fourth hole 401-HW. A top surface (or upper surface) of the fourth color element 400W and a top surface (or upper surface) of the third inorganic layer 530 may be disposed on the same surface or may be coplanar with each other. For example, the fourth color element 400W may fill (e.g., entirely fill) the fourth hole 401-HW of the bank layer 401, the fourth opening 510-OP4 of the first inorganic layer 510, the fifth opening 520-OP5 of the second inorganic layer 520, and the sixth opening 530-OP6 of the third inorganic layer 530. In an embodiment, a thickness 400Wt of the fourth color element 400W may be substantially the same as a sum of the thickness 401*t* of the bank layer 401, the thickness 510*t* of the first inorganic layer 510, the thickness 520*t* of the second inorganic layer 520, and a thickness 530*t* of the third inorganic layer 530.

The fourth color element 400W may include a light-transmitting material.

The third color element 400B may include a third color conversion pattern layer 410B'. The third color conversion pattern layer 410B' may include quantum dots. For example, the third color conversion pattern layer 410B' may include third quantum dots. Quantum dots may be excited by incident light to emit light having different wavelengths. For example, the third quantum dots of the third color conversion pattern layer 410B' may be excited by incident white light to emit blue light.

The first to fourth light-emitting devices LED1, LED2, LED3, and LED4 may emit light of the same color. For example, the first to fourth light-emitting devices LED1, LED2, LED3, and LED4 may emit white light.

White light emitted from the first light-emitting device LED1 may excite quantum dots of the first color conversion pattern layer 410R to emit red light. The red light emitted by the quantum dots of the first color conversion pattern layer 410R may pass through the first color filter 420R. Only red light from among white light passing through the first color conversion pattern layer 410R without exciting the quantum dots may pass through the first color filter 420R. Accordingly, light emitted by passing through the first color element 400R may be red light.

White light emitted from the second light-emitting device LED2 may excite quantum dots of the second color conversion pattern layer 410G to emit green light. The green light emitted by the quantum dots of the second color conversion pattern layer 410G may pass through the second color filter 420G. Only green light from among white light passing through the second color conversion pattern layer 410G without exciting the quantum dots may pass through the second color filter 420G. Accordingly, light emitted by passing through the second color element 400G may be green light.

White light emitted from the third light-emitting device LED3 may excite quantum dots of the third color conversion pattern layer 410B' to emit blue light. The blue light emitted by the quantum dots of the third color conversion pattern layer 410B' may pass through the third color filter 420B. Only blue light from among white light passing through the third color conversion pattern layer 410B' without exciting the quantum dots may pass through the third color filter 420B. Accordingly, light emitted by passing through the third color element 400B may be blue light.

White light emitted from the fourth light-emitting device LED4 may pass through the fourth color element 400W. Accordingly, light emitted by passing through the fourth color element 400W may be white light.

Figure 9:
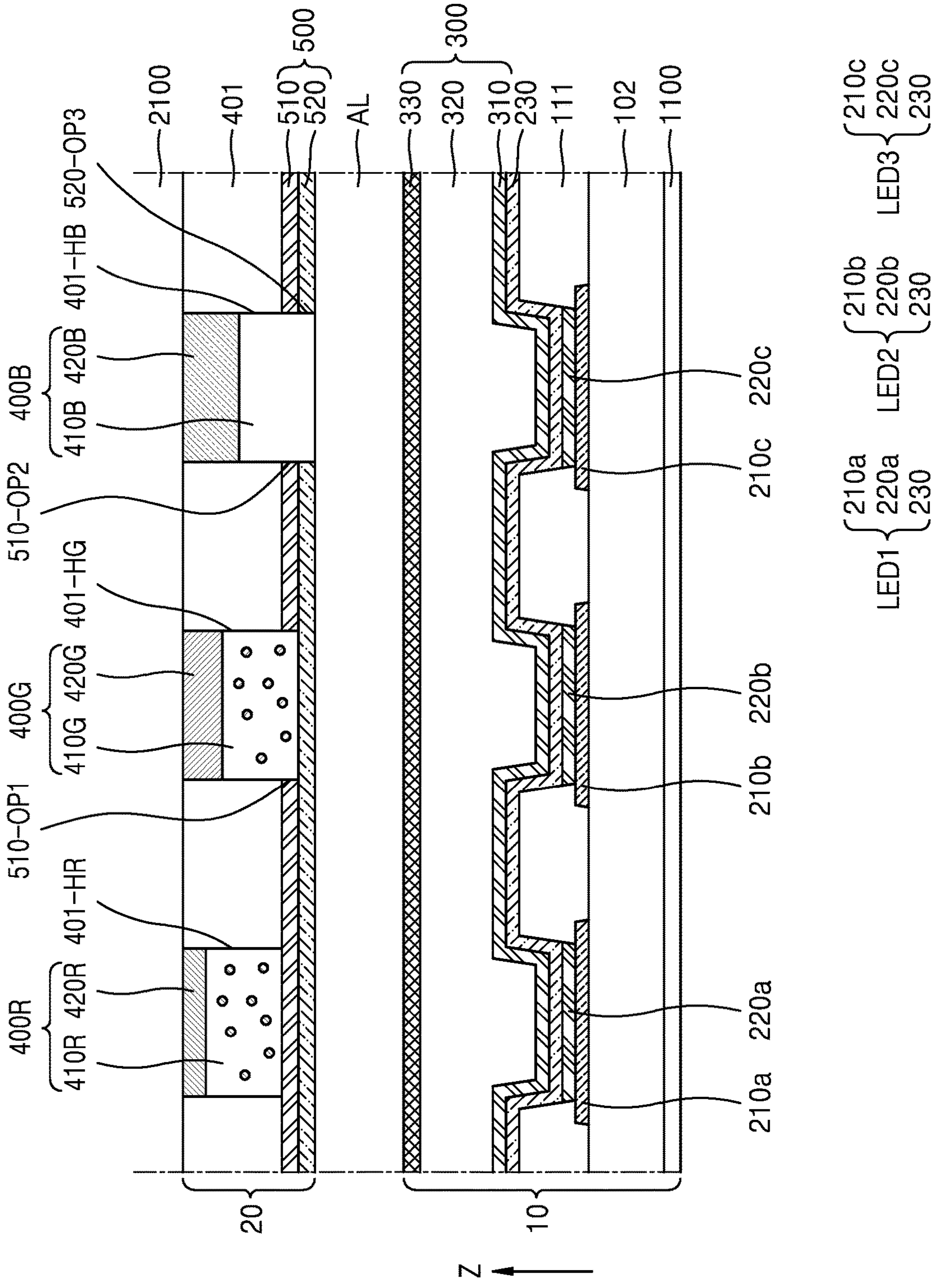
FIG. 9 is a schematic cross-sectional view illustrating a part of a display apparatus according to an embodiment.

FIG. 9 is a schematic cross-sectional view illustrating a part of a display apparatus according to an embodiment.

Referring to FIG. 9, elements of the color element unit 20 described with reference to FIG. 4 may be formed on the second substrate 2100, and may be turned upside down so that the second substrate 2100 may be disposed at the top of the display apparatus of FIG. 4. Accordingly, in the description of the second substrate 2100 and the color element unit 20 of FIG. 9, in case that 'A layer' is disposed under 'B layer', it means that 'A layer' is substantially stacked on 'B layer' and is turned upside down to face the display unit 10.

The color element unit 20 and the second substrate 2100 may be sequentially disposed on the display unit 10 including the first substrate 1100. The display unit 10 and the color element unit 20 may be adhered to each other through the adhesive layer AL.

The adhesive layer AL may include, for example, an optically clear adhesive (OCA) or an optically clear resin (OCR). However, embodiments are not limited thereto. In another example, the adhesive layer AL may be omitted, and a top surface (or upper surface) of the encapsulation layer 300 of the display unit 10 and a bottom surface (or lower surface) of the second inorganic layer 520 of the color element unit 20 may contact (e.g., directly contact) each other.

The bank layer 401 may be disposed under the second substrate 2100. The bank layer 401 may include the first to third holes 401-HR, 401-HG, and 401-HB overlapping the first to third light-emitting devices LED1, LED2, and LED3. For example, the bank layer 401 may include the first 401-HR overlapping the first light-emitting device LED1, the second hole 401-HG overlapping the second light-emitting device LED2, and the third hole 401-HB overlapping the third light-emitting device LED3. The first to third holes 401-HR, 401-HG, and 401-HB of the bank layer 401 may be penetration-holes. For example, a bottom surface (or lower surface) of the second substrate 2100 may be exposed through the first to third holes 401-HR, 401-HG, and 401-HB.

At least parts of the first to third color elements 400R, 400G, and 400B may be disposed in the first to third holes 401-HR, 401-HG, and 401-HB of the bank layer 401. For example, the first color element 400R may be disposed in the first hole 401-HR. At least a part of the second color element 400G may be disposed in the second hole 401-HG, and at least a part of the third color element 400B may be disposed in the third hole 401-HB.

A bottom surface (or lower surface) of the first color element 400R and a bottom surface (or lower surface) of the bank layer 401 may be disposed on the same surface or may be coplanar with each other. For example, the first color element 400R may fill (e.g., entirely fill) the first hole 401-HR of the bank layer 401.

The first inorganic layer 510 may be disposed under the bank layer 401. The first inorganic layer 510 may overlap the first color element 400R. The first inorganic layer 510 may include the first opening 510-OP1 overlapping the second hole 401-HG of the bank layer 401 and the second hole 510-OP2 overlapping the third hole 401-HB.

Widths of the openings 510-OP1 and 510-OP2 of the first inorganic layer 510 and widths of the holes 401-HG and 401-HB of the bank layer 401 may be substantially the same as each other. For example, a width of the first opening 510-OP1 of the first inorganic layer 510 and a width of the second hole 401-HG of the bank layer 401 may be substantially the same as each other, and a width of the second opening 510-OP2 and a width of the third hole 401-HB may be substantially the same as each other.

A bottom surface (or lower surface) of the second color element 400G and a bottom surface (or lower surface) of the first inorganic layer 510 may be disposed on the same surface or may be coplanar with each other. For example, the second color element 400G may fill (e.g., entirely fill) the second hole 401-HG of the bank layer 401 and the first opening 510-OP1 of the first inorganic layer 510.

The second inorganic layer 520 may be disposed under the first inorganic layer 510. The second inorganic layer 520 may overlap the first color element 400R and the second color element 400G. The second inorganic layer 520 may include the third opening 520-OP3 overlapping the third hole 401-HB of the bank layer 401.

A width of the third opening 520-OP3 of the second inorganic layer 520 and a width of the third hole 401-HB of the bank layer 401 may be substantially the same as each other.

A bottom surface (or lower surface) of the third color element 400B and a bottom surface (or lower surface) of the second inorganic layer 520 may be disposed on the same surface or may be coplanar with each other. For example, the third color element 400B may fill (e.g., entirely fill) the third hole 401-HB of the bank layer 401, the second opening 510-OP2 of the first inorganic layer 510, and the third opening 520-OP3 of the second inorganic layer 520.

Each of the first to third color elements 400R, 400G, and 400B may include a color conversion pattern layer or a light-transmitting pattern layer. For example, the first color element 400R may include the first color conversion pattern layer 410R, the second color element 400G may include the second color conversion pattern layer 410G, and the third color element 400B may include the light-transmitting pattern layer 410B.

Each of the first to third color elements 400R, 400G, and 400B may include a color filter. For example, the first color element 400R may include the first color filter 420R, the second color element 400G may include the second color filter 420G, and the third color element 400B may include the third color filter 420B.

The first and second color conversion pattern layers 410R and 410G and the light-transmitting pattern layer 410B may be disposed under the first to third color filters 420R, 420G, and 420B. For example, the first color conversion pattern layer 410R may be disposed under the first color filter 420R. The second color conversion pattern layer 410G may be disposed under the second color filter 420G. The light-transmitting pattern layer 410B may be disposed under the third color filter 420B.

For example, bottom surfaces (or lower surfaces) of the first and second color conversion pattern layers 410R and 410G and the light-transmitting pattern layer 410B and at least one of a bottom surface (or lower surface) of the bank layer 401, a bottom surface (or lower surface) of the first inorganic layer 510, and a bottom surface (or lower surface) of the second inorganic layer 520 may be respectively disposed on the same surface or may be coplanar with each other. For example, a bottom surface (or lower surface) of the first color conversion pattern layer 410R and a bottom surface (or lower surface) of the bank layer 401 may be disposed on the same surface or may be coplanar with each other. A bottom surface (or lower surface) of the second color conversion pattern layer 410G and a bottom surface (or lower surface) of the first inorganic layer 510 may be disposed on the same surface or may be coplanar with each other. A bottom surface (or lower surface) of the light-transmitting pattern layer 410B and a bottom surface (or lower surface) of the second inorganic layer 520 may be disposed on the same surface or may be coplanar with each other.

As described above, according to an embodiment, there may be provided a display apparatus in which a thickness of a color element pattern layer corresponding to each sub-pixel is different. For example, there may be provided a method of manufacturing a display apparatus, including applying a color element layer on an entire surface of a bank layer having a hole and removing a portion of the color element layer disposed outside the hole of the bank layer to form each color element pattern layer. However, the scope of the disclosure is not limited by this effect.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:
a first light-emitting device;
a second light-emitting device adjacent to the first light-emitting device;
a third light-emitting device adjacent to the second light-emitting device;
a bank layer disposed on the first light-emitting device, the second light-emitting device, and the third light-emitting device, the bank layer comprising:
a first hole overlapping the first light-emitting device,
a second hole overlapping the second light-emitting device, and
a third hole overlapping the third light-emitting device;
a first color element disposed in the first hole;
a second color element disposed in the second hole;
a third color element disposed in the third hole;
a first inorganic layer overlapping the first color element on the bank layer, the first inorganic layer comprising:
a first opening overlapping the second color element, and
a second opening overlapping the third color element; and
a second inorganic layer disposed on the first inorganic layer.

2. The display apparatus of claim 1, wherein the second inorganic layer overlaps the first color element and the second color element, and comprises an opening overlapping the third color element.

3. The display apparatus of claim 1, wherein the first light-emitting device, the second light-emitting device, and the third light-emitting device emit light of a same color.

4. The display apparatus of claim 1, wherein each of the first inorganic layer and the second inorganic layer comprises an inorganic insulating material.

5. The display apparatus of claim 1, wherein an upper surface of the first color element and an upper surface of the bank layer are coplanar with each other.

6. The display apparatus of claim 5, wherein
an upper surface of the second color element and an upper surface of the first inorganic layer are coplanar with each other, and
an upper surface of the third color element and an upper surface of the second inorganic layer are coplanar with each other.

7. The display apparatus of claim 1, wherein
the first color element comprises a first color conversion pattern layer comprising first quantum dots,
the second color element comprises a second color conversion pattern layer comprising second quantum dots, and
the third color element comprises a light-transmitting pattern layer.

8. The display apparatus of claim 7, wherein
the first color element further comprises a first color filter,
the second color element further comprises a second color filter, and
the third color element further comprises a third color filter.

9. The display apparatus of claim 1, further comprising:
a third inorganic layer disposed on the second inorganic layer and overlapping the first color element, the second color element, and the third color element.

10. The display apparatus of claim 9, further comprising:
a fourth light-emitting device adjacent to the third light-emitting device; and
a fourth color element disposed in a fourth hole of the bank layer overlapping the fourth light-emitting device.

11. The display apparatus of claim 10, wherein the first light-emitting device, the second light-emitting device, the third light-emitting device, and the fourth light-emitting device emit white light.

12. The display apparatus of claim 11, wherein
the first color element comprises a first color filter,
the second color element comprises a second color filter,
the third color element comprises a third color filter, and
the fourth color element comprises a light-transmitting pattern layer.

13. A method of manufacturing a display apparatus, the method comprising:
forming a first light-emitting device, a second light-emitting device, and a third light-emitting device;
forming a bank layer on the first light-emitting device, the second light-emitting device, and the third light-emitting device;
forming, in the bank layer, a first hole overlapping the first light-emitting device;
forming a first color element forming layer on the bank layer so that at least a part of the first color element forming layer is disposed in the first hole;
removing a part of the first color element forming layer formed outside the first hole so that a first color element is disposed in the first hole;
forming a first inorganic layer comprising an opening overlapping the second light-emitting device on the bank layer, the first inorganic layer overlapping the first color element;
forming, in the bank layer, a second hole overlapping the second light-emitting device;
forming a second color element forming layer on the bank layer so that at least a part of the second color element forming layer is disposed in the second hole;
removing a part of the second color element forming layer formed outside the second hole so that a second color element is disposed in the second hole; and
forming a second inorganic layer on the first inorganic layer.

14. The method of claim 13, wherein, in the forming of the second inorganic layer, the second inorganic layer overlaps the first color element disposed in the first hole of the bank layer and the second color element disposed in the second hole of the bank layer, and comprises an opening overlapping the third light-emitting device.

15. The method of claim 14, further comprising:
forming, in the first inorganic layer, an opening overlapping the third light-emitting device.

16. The method of claim 15, further comprising:
forming, in the bank layer, a third hole overlapping the third light-emitting device;
forming a third color element forming layer on the bank layer so that at least a part of the third color element forming layer is disposed in the third hole; and
removing a part of the third color element forming layer formed outside the third hole so that a third color element is disposed in the third hole.

17. The method of claim 13, wherein,
in the removing of the part of the first color element forming layer, an upper surface of the first color element and an upper surface of the bank layer are coplanar with each other, and
in the removing of the part of the second color element forming layer, an upper surface of the second color element and an upper surface of the first inorganic layer are coplanar with each other.

18. The method of claim 16, wherein, in the removing of the part of the third color element forming layer, an upper surface of the third color element and an upper surface of the second inorganic layer are coplanar with each other.

19. The method of claim 13, wherein the forming of the first color element forming layer comprises forming a first color conversion layer comprising first quantum dots, and the forming of the second color element forming layer comprises forming a second color conversion layer comprising second quantum dots.

20. The method of claim 19, wherein the forming of the first color element forming layer comprises forming a first color filter layer disposed on the first color conversion layer, and the forming of the second color element forming layer comprises forming a second color filter layer disposed on the second color conversion layer.

* * * * *